(12) United States Patent
Baldemair et al.

(10) Patent No.: US 9,277,546 B2
(45) Date of Patent: *Mar. 1, 2016

(54) SYSTEM AND METHOD FOR SIGNALING CONTROL INFORMATION IN A MOBILE COMMUNICATION NETWORK

(71) Applicant: Telefonaktiebolaget L M Ericsson (publ), Stockholm (SE)

(72) Inventors: Robert Baldemair, Solna (SE); Daniel Larsson, Vallentuna (SE); Dirk Gerstenberger, Vallentuna (SE); Jung-Fu Cheng, Fremont, CA (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 14/325,287

(22) Filed: Jul. 7, 2014

(65) Prior Publication Data

US 2014/0321395 A1 Oct. 30, 2014

Related U.S. Application Data

(63) Continuation of application No. 13/077,272, filed on Mar. 31, 2011, now Pat. No. 8,774,123.

(60) Provisional application No. 61/320,167, filed on Apr. 1, 2010, provisional application No. 61/322,190, filed on Apr. 8, 2010.

(51) Int. Cl.
*H04W 72/04* (2009.01)
*H03M 13/13* (2006.01)
(Continued)

(52) U.S. Cl.
CPC ........ *H04W 72/0413* (2013.01); *H03M 13/136* (2013.01); *H03M 13/45* (2013.01);
(Continued)

(58) Field of Classification Search
USPC .......................................... 370/328, 329, 330
See application file for complete search history.

(56) References Cited

U.S. PATENT DOCUMENTS 5,926,488 A 7/1999 Khayrallah
7,068,683 B1 6/2006 Lundby et al.
(Continued)

FOREIGN PATENT DOCUMENTS

EP 1447938 A2 8/2004
WO 2007/011984 A1 1/2007

OTHER PUBLICATIONS

3GPP. 3rd Generation Partnership Project Technical Specification Group Radio Access Network; Evolved Universal Terrestrial Radio Access (E-UTRA); Physical Channels Modulation (Release 9). 3GPP TS 36211 v9.1.0 (Mar. 2010).

(Continued)

*Primary Examiner* — Dang Ton
*Assistant Examiner* — Robert M Morlan

(57) ABSTRACT

A method of operating a wireless communication terminal includes receiving one or more downlink control messages that each contain scheduling information scheduling the wireless terminal to receive a downlink transmission on either a primary carrier or a secondary carrier. The method also includes determining, for each of the downlink control messages, whether that message includes scheduling information for the primary carrier or for a secondary carrier. Additionally, the method includes selecting a format for an uplink control message based on whether any of the downlink control messages includes scheduling information for a secondary carrier, generating an uplink control message based on the selected format, and transmitting the uplink control message to the base station.

10 Claims, 9 Drawing Sheets

(51) Int. Cl.

| | |
|---|---|
| H03M 13/45 | (2006.01) |
| H03M 13/00 | (2006.01) |
| H04L 1/00 | (2006.01) |
| H04L 5/00 | (2006.01) |
| H04W 28/20 | (2009.01) |
| H04W 52/18 | (2009.01) |
| H04W 52/14 | (2009.01) |

(52) U.S. Cl.
CPC ........ *H03M13/635* (2013.01); *H03M 13/6525* (2013.01); *H04L 1/0045* (2013.01); *H04L 1/0057* (2013.01); *H04L 5/001* (2013.01); *H04L 5/0053* (2013.01); *H04L 5/0094* (2013.01); *H04W 28/20* (2013.01); *H04W 52/146* (2013.01); *H04W 52/18* (2013.01)

(56) References Cited

U.S. PATENT DOCUMENTS

| | | | |
|---|---|---|---|
| 2010/0056202 A1 | 3/2010 | Li | |
| 2010/0271970 A1 | 10/2010 | Pan et al. | |
| 2010/0273515 A1* | 10/2010 | Fabien et al. | 455/509 |
| 2010/0331037 A1* | 12/2010 | Jen | 455/522 |
| 2011/0243087 A1* | 10/2011 | Ahn et al. | 370/329 |

OTHER PUBLICATIONS

3GPP. $3^{rd}$ Generation Partnership Project: Technical Specification Group Radio Access Network; Evolved Universal Terrestrial Radio Access (E-UTRA); Multiplexing and Channel Coding (Release 9). 3GPP TS 36.212 v9. 1.0 (Jun. 2010).

3GPP. 3'' Generation Partnership Project: Technical Specification Group Radio Access Network; Evolved Universal Terrestrial Radio Access {E-UTRA); Physical layer Procedures (Release 9). 3GPP TS 36.213 v9.2.0 (Jun. 2010).

Nokia Siemens Networks "L1 control signaling with carrier aggregation in LTE- Advanced". R1-063730, Sep. 29, 2008. pp. 1-6, XP006137220.

Sharp "PDCCH structure for carrier aggregation in LTE Advanced" 3GPP Draft: R 1-093184. 3rd Generation Partnership Project (3GPP). Aug. 18, 2009. XP050351540.

Motorola: "Common PDCCH Design for Carrier Aggregation, R1-091327" 3GPP TSG Ran 1 Mar. 23-27, 2009. XP002597046, Seoul, South Korea.

Motorola: Uplink Control Signaling Design for Carrier Aggregation', 3GPP Draft: R1-092172. Apr. 26. 2009_XP050339608. San Francisco, USA.

Ericsson, et al On PUCCH Resource Allocation for Carrier Aggregation. 3GPP Draft; R1-100845. Feb. 16, 2010.

\* cited by examiner

Example Power Control Parameters
*(2 configured CCs, no spatial feedback bundling)*

| SCHEDULED CC INDICES | INCREMENTAL POWER SETTING FOR SCHEDULING SCC |
|---|---|
| 0,1 | +0 dB |
| 1 | +0 dB |

*FIG. 3A*

Example Power Control Parameters
*(3 configured CCs, no spatial feedback bundling)*

| SCHEDULED CC INDICES | INCREMENTAL POWER SETTING FOR SCHEDULING SCC |
|---|---|
| 0,1,2 | +0 dB |
| 0,1 | +0 dB |
| 0,2 | +0 dB |
| 1,2 | +0 dB |
| 1 | +0 dB |
| 2 | +0 dB |

*FIG. 3B*

Example Power Control Parameters
*(3 Configured CCs, No Spatial Feedback Bundling)*

| SCHEDULED CC INDICES | INCREMENTAL TPC SETTING IN DCI FOR SCHEDULING SCC |
|---|---|
| 0,1,2,3 | +0 DB |
| 0,1,2 | +0 DB |
| 0,1,3 | +1 DB |
| 0,2,3 | +0 DB |
| 1,2,3 | +1 DB |
| 0,1 | +0 DB |
| 0,2 | +0 DB |
| 1,2 | +0 DB |
| 0,3 | +0 DB |
| 1,3 | +0 DB |
| 2,3 | +1 DB |
| 1 | +0 DB |
| 2 | +0 DB |
| 3 | +0 DB |

*FIG. 3C*

Example Power Control Parameters
(3 configured CCs, no spatial feedback bundling)

| SCHEDULED CC INDICES | INCREMENTAL TPC SETTING IN DCI FOR SCHEDULING SCC |
|---|---|
| 0,1,2,3,4 | +0 DB |
| 0,1,2,3 | +0 DB |
| 0,1,2,4 | +0 DB |
| 0,1,3,4 | +0 DB |
| 0,2,3,4 | +0 DB |
| 1,2,3,4 | +0 DB |
| 0,1,2 | +0 DB |
| 0,1,3 | +1 DB |
| 0,2,3 | +0 DB |
| 1,2,3 | +1 DB |
| 0,1,4 | +1 DB |
| 0,2,4 | +0 DB |
| 1,2,4 | +1 DB |
| 0,3,4 | +0 DB |
| 1,3,4 | +1 DB |
| 2,3,4 | +1 DB |
| 0,1 | +0 DB |
| 0,2 | +0 DB |
| 1,2 | +0 DB |
| 0,3 | +0 DB |
| 1,3 | +0 DB |
| 2,3 | +1 DB |
| 0,4 | +0 DB |
| 1,4 | +1 DB |
| 2,4 | +0 DB |
| 3,4 | +0 DB |
| 1 | +0 DB |
| 2 | +0 DB |
| 3 | +0 DB |
| 4 | +0 DB |

*FIG. 3D*

Example Hypothesis/Covering Vector Combinations (for (32,10) Reed-Muller code)

| | | | | | | | | | | | | | | | | | |
|---|---|---|---|---|---|---|---|---|---|---|---|---|---|---|---|---|---|
| HYPOTHESIS | $O_6$ | 0 | 0 | 0 | 0 | 0 | 0 | 0 | 0 | 1 | 1 | 1 | 1 | 1 | 1 | 1 | 1 |
| | $O_7$ | 0 | 0 | 0 | 0 | 1 | 1 | 1 | 1 | 0 | 0 | 0 | 0 | 1 | 1 | 1 | 1 |
| | $O_8$ | 0 | 0 | 1 | 1 | 0 | 0 | 1 | 1 | 0 | 0 | 1 | 1 | 0 | 0 | 1 | 1 |
| | $O_9$ | 0 | 1 | 0 | 1 | 0 | 1 | 0 | 1 | 0 | 1 | 0 | 1 | 0 | 1 | 0 | 1 |
| COVERING VECTOR | $C_0$ | 1 | 1 | 1 | 1 | 1 | 1 | 1 | 1 | 1 | 1 | 1 | 1 | 1 | 1 | 1 | 1 |
| | $C_1$ | 1 | 1 | 1 | 1 | 1 | 1 | 1 | 1 | 1 | 1 | 1 | 1 | 1 | 1 | 1 | 1 |
| | $C_2$ | 1 | 1 | 1 | 1 | 1 | 1 | 1 | 1 | -1 | -1 | -1 | -1 | -1 | -1 | -1 | -1 |
| | $C_3$ | 1 | -1 | 1 | -1 | 1 | -1 | 1 | -1 | 1 | -1 | 1 | -1 | 1 | -1 | 1 | -1 |
| | $C_4$ | 1 | -1 | -1 | 1 | 1 | -1 | -1 | 1 | 1 | -1 | -1 | 1 | 1 | -1 | -1 | 1 |
| | $C_5$ | 1 | -1 | 1 | -1 | 1 | -1 | 1 | -1 | 1 | -1 | 1 | -1 | 1 | -1 | 1 | -1 |
| | $C_6$ | 1 | 1 | -1 | -1 | 1 | 1 | -1 | -1 | 1 | 1 | -1 | -1 | 1 | 1 | -1 | -1 |
| | $C_7$ | 1 | 1 | 1 | 1 | -1 | -1 | -1 | -1 | 1 | 1 | 1 | 1 | -1 | -1 | -1 | -1 |
| | $C_8$ | 1 | 1 | -1 | -1 | -1 | -1 | 1 | 1 | 1 | 1 | -1 | -1 | -1 | -1 | 1 | 1 |
| | $C_9$ | 1 | 1 | -1 | -1 | -1 | -1 | 1 | 1 | -1 | -1 | 1 | 1 | 1 | 1 | -1 | -1 |
| | $C_{10}$ | 1 | -1 | -1 | 1 | 1 | -1 | -1 | 1 | -1 | 1 | 1 | -1 | -1 | 1 | 1 | -1 |
| | $C_{11}$ | 1 | -1 | -1 | 1 | 1 | -1 | -1 | 1 | -1 | 1 | 1 | -1 | -1 | 1 | 1 | -1 |
| | $C_{12}$ | 1 | 1 | -1 | -1 | -1 | -1 | 1 | 1 | 1 | 1 | -1 | -1 | -1 | -1 | 1 | 1 |
| | $C_{13}$ | 1 | -1 | 1 | -1 | -1 | 1 | -1 | 1 | 1 | -1 | 1 | -1 | -1 | 1 | -1 | 1 |
| | $C_{14}$ | 1 | 1 | 1 | 1 | -1 | -1 | -1 | -1 | 1 | 1 | 1 | 1 | -1 | -1 | -1 | -1 |
| | $C_{15}$ | 1 | -1 | -1 | 1 | -1 | 1 | 1 | -1 | 1 | -1 | -1 | 1 | -1 | 1 | 1 | -1 |
| | $C_{16}$ | 1 | 1 | 1 | 1 | 1 | 1 | 1 | 1 | -1 | -1 | -1 | -1 | -1 | -1 | -1 | -1 |
| | $C_{17}$ | 1 | 1 | 1 | 1 | -1 | -1 | -1 | -1 | -1 | -1 | -1 | -1 | 1 | 1 | 1 | 1 |
| | $C_{18}$ | 1 | -1 | 1 | -1 | 1 | -1 | 1 | -1 | -1 | 1 | -1 | 1 | -1 | 1 | -1 | 1 |
| | $C_{19}$ | 1 | 1 | -1 | -1 | 1 | 1 | -1 | -1 | -1 | -1 | 1 | 1 | -1 | -1 | 1 | 1 |
| | $C_{20}$ | 1 | -1 | -1 | 1 | 1 | -1 | -1 | 1 | -1 | 1 | 1 | -1 | -1 | 1 | 1 | -1 |
| | $C_{21}$ | 1 | -1 | 1 | -1 | -1 | 1 | -1 | 1 | -1 | 1 | -1 | 1 | 1 | -1 | 1 | -1 |
| | $C_{22}$ | 1 | -1 | -1 | 1 | -1 | 1 | 1 | -1 | -1 | 1 | 1 | -1 | 1 | -1 | -1 | 1 |
| | $C_{23}$ | 1 | -1 | -1 | 1 | 1 | -1 | -1 | 1 | -1 | 1 | 1 | -1 | -1 | 1 | 1 | -1 |
| | $C_{24}$ | 1 | 1 | 1 | 1 | -1 | -1 | -1 | -1 | 1 | 1 | 1 | 1 | -1 | -1 | -1 | -1 |
| | $C_{25}$ | 1 | -1 | 1 | -1 | -1 | 1 | -1 | 1 | 1 | -1 | 1 | -1 | -1 | 1 | -1 | 1 |
| | $C_{26}$ | 1 | 1 | -1 | -1 | 1 | 1 | -1 | -1 | -1 | -1 | 1 | 1 | -1 | -1 | 1 | 1 |
| | $C_{27}$ | 1 | -1 | 1 | -1 | 1 | -1 | 1 | -1 | 1 | -1 | 1 | -1 | 1 | -1 | 1 | -1 |
| | $C_{28}$ | 1 | 1 | 1 | 1 | 1 | 1 | 1 | 1 | 1 | 1 | -1 | -1 | 1 | 1 | -1 | -1 |
| | $C_{29}$ | 1 | 1 | 1 | 1 | -1 | -1 | -1 | -1 | 1 | 1 | -1 | -1 | 1 | 1 | 1 | 1 |
| | $C_{30}$ | 1 | 1 | -1 | -1 | -1 | -1 | 1 | 1 | -1 | -1 | 1 | 1 | 1 | 1 | -1 | -1 |
| | $C_{31}$ | 1 | -1 | -1 | 1 | -1 | 1 | 1 | -1 | 1 | -1 | -1 | 1 | -1 | 1 | 1 | 1 |

*FIG. 4*

Comparison of Example Decoding Complexities
(for 5 configured CCs, without feedback bundling)

| SCHEDULED CC INDICES | BRUTE-FORCE ML DECODING COMPLEXITY | EFFICIENT ML DECODING COMPLEXITY |
|---|---|---|
| 0,1,2,3,4 | 32768 | 3072 |
| 0,1,2,3 | 8192 | 768 |
| 0,1,2,4 | 8192 | 768 |
| 0,1,3,4 | 8192 | 3072 |
| 0,2,3,4 | 8192 | 3072 |
| 1,2,3,4 | 8192 | 3072 |
| 0,1,2 | 2048 | 160 |
| 0,1,3 | 2048 | 768 |
| 0,2,3 | 2048 | 768 |
| 1,2,3 | 2048 | 768 |
| 0,1,4 | 2048 | 768 |
| 1,2,4 | 2048 | 768 |
| 0,1 | 2048 | 768 |
| 0,2,4 | 512 | 160 |
| 0,2 | 512 | 160 |
| 1,2 | 512 | 160 |

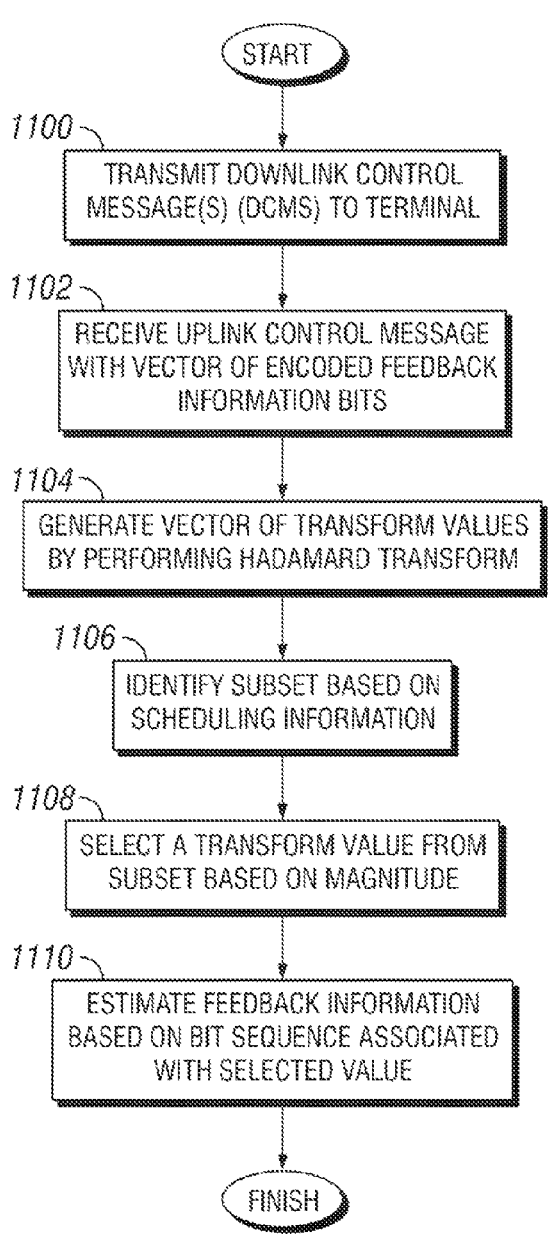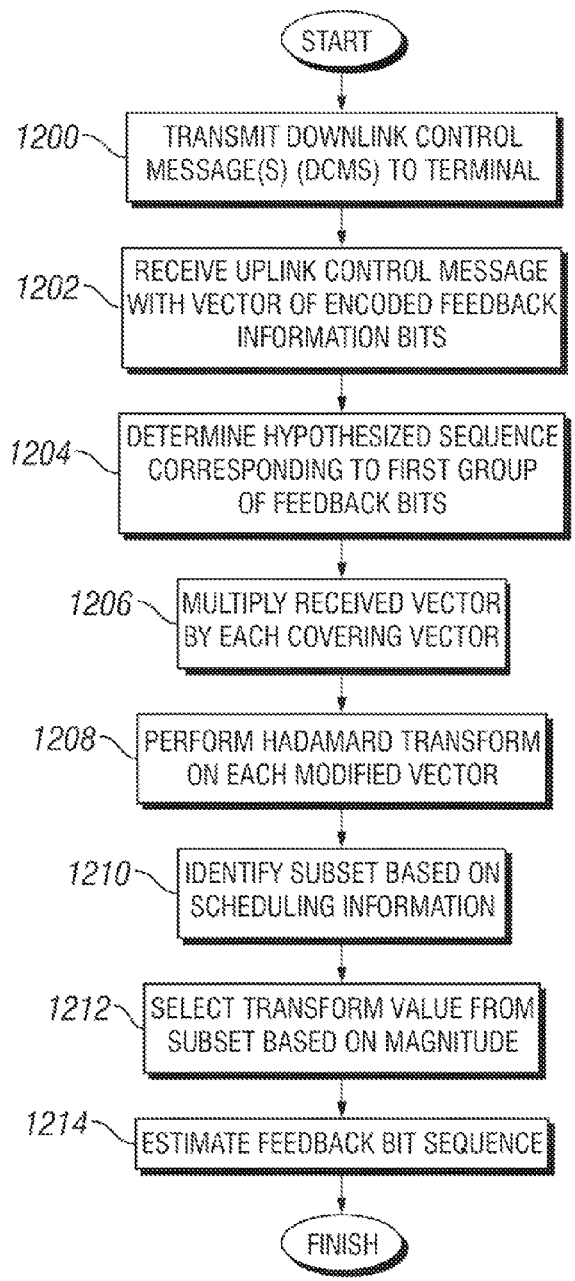
FIG. 11
FIG. 12

SYSTEM AND METHOD FOR SIGNALING CONTROL INFORMATION IN A MOBILE COMMUNICATION NETWORK

PRIORITY CLAIM UNDER 35 U.S.C. 119(e)

This application is a continuation of U.S. patent application Ser. No. 13/077,272, filed Mar. 31, 2011, entitled "System and Method for Signaling Control Information in a Mobile Communication Network" and claims the benefit of U.S. Provisional Application No. 61/320,167, filed Apr. 1, 2010, entitled "TPC Command Transmission in Carrier Aggregation," and U.S. Provisional Application No. 61/322,190, filed Apr. 8, 2010, entitled "Efficient Decoding Methods and Apparatus for Block Coded Messages with Know Subset of Bit Values," both of which are incorporated by reference in their entirety.

TECHNICAL FIELD OF THE INVENTION

This disclosure relates in general to wireless communication and, more particularly, to managing the transmission power of a mobile terminal.

BACKGROUND OF THE INVENTION

Modern mobile communication networks face an ever increasing demand for high-bandwidth communication services under a wide variety of radio conditions. Some communication technologies have responded to this need by utilizing an expanded radiofrequency spectrum. For example, Release 8 of the 3GPP Long Term Evolution (LTE) standard utilized a 20-MHz bandwidth for carrier signals, but Release 10 is expected to utilize a spectrum of 100-MHz or more.

Because backwards compatibility is often a requirement for mobile communication networks, networks supporting use of expanded spectrums are often required to support legacy devices incapable of recognizing or utilizing their larger bandwidth. The need to support terminals having a range of different capabilities creates significant difficulties in managing resource use in such networks. To facilitate use of expanded carrier spectrums while still maintaining backwards compatibility, certain communication technologies, such as LTE, utilize a "carrier aggregation" scheme. Under such a scheme, a legacy terminal that is incapable of using the entirety of the expanded carrier spectrum will recognize the expanded spectrum as multiple separate carrier spectrums, referred to as "Component Carriers" (CCs) that are each sized to fit the capabilities of the legacy terminal. Meanwhile current-generation terminals will be able to utilize a larger carrier spectrum by aggregating multiple CCs.

However, use of multiple separate carrier spectrums can significantly complicate configuration and management of networks. For example, if the network attempts to notify a mobile device over a non-ideal radio channel that the device has been scheduled to use a particular component carrier, the mobile device may not successfully receive the notification. Even though many modern communication technologies provide procedures for a device to request retransmission of information that was not successfully received, it may be difficult or impossible for a device to determine that it has not received scheduling information if the device is uncertain what scheduling information to expect. Furthermore, while the device could simply report on all the scheduling information it receives, and thereby permit the network to determine by deduction what scheduling information the device did not receive, a significant amount of the network's transmission resource would be used up unnecessarily on such signaling when the mobile device successfully receives all the scheduling information. Thus, finding an effective scheme for communicating information about the scheduling of component carriers-one that can accommodate and adapt to transmission errors—can be critical to performance in networks that support carrier aggregation.

SUMMARY OF THE INVENTION

In accordance with the present disclosure, certain disadvantages and problems associated with mobile communication have been substantially reduced or eliminated. In particular, certain devices and techniques for providing mobile telecommunication service are described.

In accordance with one embodiment of the present disclosure, a method of operating a wireless communication terminal includes receiving downlink control messages that contain scheduling information scheduling the wireless terminal to receive a downlink transmission on either a primary carrier or a secondary carrier. The method also includes determining, for each of the downlink control messages, whether that message includes scheduling information for the primary carrier or for a secondary carrier. Additionally, the method includes selecting a format for an uplink control message based on whether any of the downlink control messages includes scheduling information scheduling the wireless terminal to receive a downlink transmission on a secondary carrier, generating an uplink control message based on the selected format, and transmitting the uplink control message to the base station. In accordance with another embodiment of the present disclosure, an apparatus is operable to implement this method.

In accordance with another embodiment of the present disclosure, a method of operating a wireless communication terminal includes receiving downlink control messages that contain scheduling information scheduling the wireless terminal to receive a downlink transmission on either a primary carrier or a secondary carrier. Each downlink control message also contains a power control parameter. The method further includes determining, for each of the downlink control messages, whether that downlink control message includes scheduling information for the primary carrier or for a secondary carrier. Additionally, the method includes determining a transmission power level for an uplink control message based on whether any of the downlink control messages includes scheduling information for a secondary carrier, generating an uplink control message, and transmitting the uplink control message to the base station at the determined transmission power level. In accordance with another embodiment of the present disclosure, an apparatus is operable to implement this method.

In accordance with another embodiment of the present disclosure, a method of operating a network node in an access network includes scheduling a wireless terminal to receive a downlink transmission on a primary carrier and one or more secondary carriers. The method also includes determining a first power control parameter for the wireless terminal to use in transmitting an uplink control message in accordance with a first format and generating a downlink control message that includes the first power control parameter and scheduling information for the primary carrier. The method further includes determining one or more additional power control parameters for the wireless terminal to use in transmitting an uplink control message in accordance with a second format and generating downlink control messages that include the additional power control parameters and scheduling information for secondary carriers. Additionally, the method includes transmitting the first and additional downlink control messages to the wireless terminal. In accordance with another embodiment of the present disclosure, an apparatus is operable to implement this method.

Important technical advantages of certain embodiments of the present invention include reducing the required overhead for control signaling in systems supporting carrier aggregation. Particular embodiments may be capable of limiting the control signaling overhead associated with carrier aggregation when a terminal is not utilizing multiple component carriers. Additionally, particular embodiments may be able to provide this overhead reduction using a robust signaling scheme that can adapt to transmission errors that may impair the relevant signaling. Other advantages of the present invention will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which:

FIGS. 3A-3D are tables providing example power control parameters that may be utilized in particular embodiments of the mobile communication system of FIG. 2;

FIG. 4 is a table of covering vectors that may be utilized to decode information in particular embodiments of the mobile communication system;

FIGS. 11-12 are flowcharts illustrating example operation of particular embodiments of the network node in decoding feedback information transmitted by the wireless terminal.

DETAILED DESCRIPTION OF THE INVENTION

Figure 1:
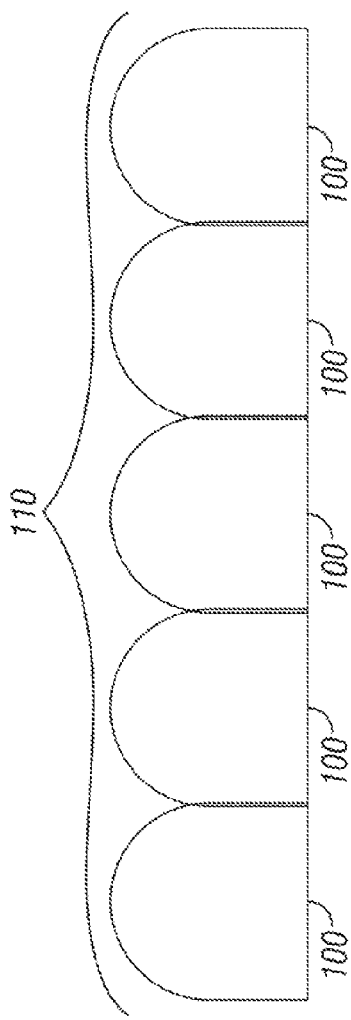
FIG. 1 illustrates the carrier spectrum for an example communication system that utilizes carrier aggregation.

FIG. 1 illustrates the carrier spectrum for an example communication system that utilizes carrier aggregation. Certain advanced communication technologies rely on carrier aggregation to facilitate use of an expanded carrier spectrum 110 in networks that must also support legacy terminals that are only capable of utilizing smaller carrier spectrums. Under a carrier aggregation scheme, expanded carrier spectrum 110 can appear to a legacy terminal as the aggregate spectrum for multiple carriers 100 (referred to as "component carriers" (CCs)), each having a smaller spectrum that is compatible with the capabilities of the legacy terminal. Current-generation terminals, however, can utilize a larger portion of the expanded spectrum 110 by transmitting or receiving over multiple of the component carriers 100.

As one example, Release 8 of the Long Term Evolution (LTE) communication standard supports a carrier spectrum having bandwidths up to 20 MHz. As a result, terminals configured to support this standard may be limited to using carriers having a bandwidth no greater than 20 MHz. However, in order to provide higher overall throughput, Release 10 of LTE is expected to support a carrier spectrum having a bandwidth larger than 20 MHz. As a result, future releases of LTE will use carrier aggregation to provide spectrum compatibility. With carrier aggregation, this overall spectrum will appear to a Release 8 terminal as the aggregate spectrum of multiple component carriers, each having a smaller spectrum (e.g., 20 MHz) compatible with the capabilities of the Release 8 terminal. Meanwhile, a Release 10 terminal may be able to utilizing the entirety of this expanded carrier spectrum 110 by utilizing multiple component carriers 100 simultaneously. While the description below focuses, for purposes of illustration, on implementing the described solutions in LTE networks, the described solutions may be implemented, with appropriate modification, to any suitable communication technologies.

Figure 2:
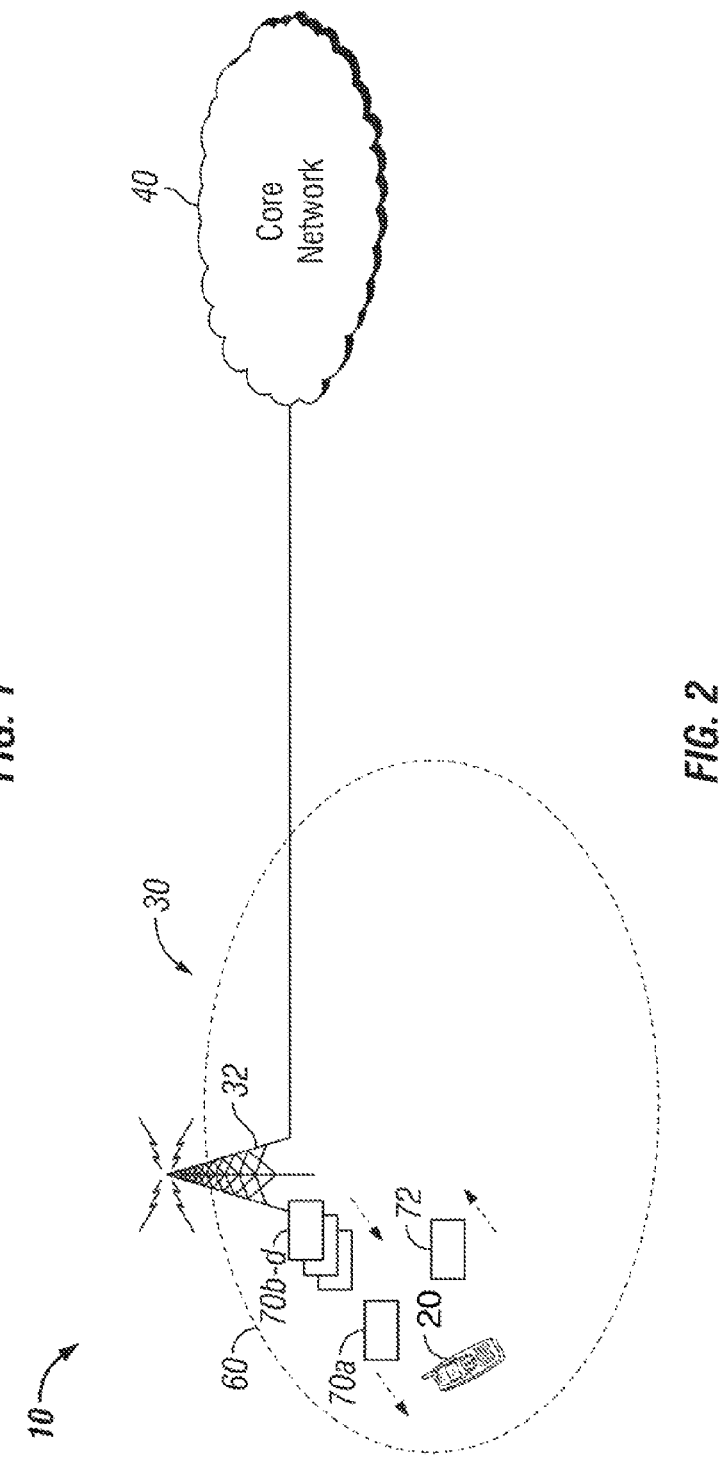
FIG. 2 illustrates a particular embodiment of a mobile communication system that supports carrier aggregation.

FIG. 2 illustrates a mobile communication system 10 that provides communication service to a wireless terminal 20 using a carrier aggregation scheme, such as the one illustrated in FIG. 1. Mobile communication system 10 includes an access network 30 that provides communication services to a cell 60 associated with mobile communication system 10 and a core network 40 that provides backhaul delivery of information within mobile communication system 10. By using signaling techniques described herein, particular embodiments of mobile communication system 10 can provide a reliable scheme for communicating scheduling information and power settings between access network 30 and wireless terminal 20 regardless of the number of components carriers configured for wireless terminal 20. Additionally, by using knowledge of the component carriers on which wireless terminal 20 has been scheduled, access network 30 can more efficiently decode feedback transmitted by wireless terminal 20 indicating the scheduled transmissions successfully received by wireless terminal 20. Consequently, as described further below, particular embodiments of mobile communication system 10 can provide robust, low-overhead techniques for managing the use of carrier aggregation.

In general, mobile communication system 10 provides mobile communication service to one or more wireless terminals 20 operating within cell 60, a geographic area associated with mobile communication system 10. Mobile communication system 10 may support communication of any suitable type and/or in accordance with any appropriate communication standards including, but not limited to, any Long Term Evolution (LTE), Worldwide Interoperability for Microwave Access (WiMAX), and Wideband Code Division Multiple Access (WCDMA) communication standards.

Wireless terminal 20 represents any device capable of communicating information wirelessly with mobile communication system 10. Examples of wireless terminal 20 include traditional communication devices such as mobile phones, personal digital assistants ("PDAs"), laptop computers, and any other portable communication device suitable for use with communication system 10. For example, in particular embodiments, wireless terminal 20 represents an instance of LTE user equipment (UE). Additionally, in particular embodiments, wireless terminal 20 may also represent automated equipment or devices equipped with components suitable to permit communication with mobile communication system 10, such as devices in a home-automation network. For example, wireless terminal 20 may represent a washing machine, oven, digital video recorder (DVRs), or other home appliances capable of remote management over mobile communication system 10. Although FIG. 2 illustrates, for the sake of simplicity, only a single wireless terminal 20 and a single base station 32, mobile communication system 10 may include any suitable number and configuration of base stations 32 capable of serving any number of wireless terminals 20 including, in particular embodiments, wireless terminals 20 having different capabilities with respect to the carrier spectrums they support.

Access network 30 communicates wirelessly with wireless terminals 20 and serves as an interface between wireless terminals 20 and core network 40. Access network 30 may represent or include a radio access network and/or any elements responsible for providing a radio or air interface for core network 40. For example, in the illustrated embodiment, access network 30 includes one or more base stations 32. Access network 30 may also include base station controllers, access servers, gateways, and/or any additional components suitable for managing radio channels used by base station 32, authenticating users, controlling handoffs between base station 32 and other radio access elements, and/or otherwise managing the interoperation of base stations 32 and interfacing base stations 32 with core network 40.

Base station 32 communicates wirelessly with wireless terminals 20 to facilitate mobile communication for wireless terminals 20. Base stations 32 may include any appropriate elements to communicate with wireless terminals 20 and to interface wireless terminals 20 with core network 40. For example, depending on the communications standards supported by access network 30 and core network 40, each base station 32 may represent or include a base station, a Node B, an evolved Node B (eNode B), a radio base station (RBS), an access point, or any other suitable element capable of communicating with wireless terminals 20 wirelessly.

Core network 40 routes voice and/or data communicated by wireless terminals 20 from access network 30 to other wireless terminals 20 or to other communication devices coupled to core network 40 through landline connections or through other networks. Core network 40 may support any appropriate standards or techniques for routing such communications. For example, in embodiments of wireless terminals 20 that support LTE, core network 40 may represent a System Architecture Evolution (SAE) core network. Core network 40 may also be responsible for aggregating communication for longhaul transmission, authenticating users, controlling calls, metering usage for billing purposes, or other functionality associated with providing communication services. In general, however, core network 40 may include any components suitable for routing and otherwise supporting voice and/or data communications for wireless terminals 20.

In operation, mobile communication system 10 provides telecommunication service to wireless terminal 20. As part of this service, access network 30 communicates wirelessly with wireless terminal 20. For example, in the illustrated embodiment, base station 32 of access network 30 establishes a wireless connection with wireless terminal 20 for communication over radiofrequency (RF) channels, and core network 40 transports voice, data, multimedia, and/or other types of information between various components of access network 30 and between other elements of mobile communication system 10, such as wireline communication devices.

To increase the available spectrum of carriers that can be utilized for communication between wireless terminal 20 and access network 30, mobile communication system 10 utilizes a carrier aggregation scheme in which one or more component carriers are configured for use in cell 60. In particular embodiments, this configuration is performed on a semi-static basis. The number of configured component carriers, as well as the bandwidth of the individual component carriers, may be different for uplink and downlink. Additionally, the number of component carriers configured in a cell may be different from the number of component carriers seen by wireless terminal 20. For example, in particular embodiments, wireless terminal 20 may support more downlink component carriers than uplink component carriers, even though cell 60 is configured with the same number of uplink and downlink component carriers. In particular embodiments, wireless terminal 20 may initially connect to access network 30 through base station 32 using only a single component carriers, and after connecting, may be provided information indicating the component carriers currently configured for use in cell 60

In order to prevent wireless terminal 20 from having to constantly monitor all component carriers configured for cell 60, an element of access network 30 (assumed to be base station 32 for purposes of this example) may be responsible for activating and deactivating the various component carriers to be used by wireless terminal 20 in cell 60. Wireless terminal 20 can then limit its monitoring to only those component carriers configured and activated for wireless terminal 20. For example, in Release 10 LTE embodiments, important control information for a component carrier will be transmitted on a Physical Downlink Control CHannel (PDCCH) and Physical Downlink Shared CHannel (PDSCH) associated with that component carrier. With activation, wireless terminal 20 can limit its monitoring of PDCCH and PDSCH to component carriers currently activated for wireless terminal 20, instead of being forced to monitor these channels for all component carriers configured for use in cell 60. In certain embodiments, activation can be achieved using faster signaling (e.g., Medium Access Control (MAC) layer signaling) than the initial configuration of component carriers, thereby reducing the amount of time and overhead used to change the number of component carriers utilized by wireless terminal 20 at a given time. For example, upon arrival of large data amounts for wireless terminal 20 multiple downlink component carriers may be activated for wireless terminal 20 and then used to transmit data to wireless terminal 20. These excess component carriers may then be de-activated for wireless terminal 20 if not needed once this data has been transmitted to wireless terminal 20.

In particular embodiments, all but one component carrier in each direction—referred to here, individually, as the "downlink primary component carrier" and the "uplink primary component carrier," or collectively, as the "primary component carrier"—can be de-activated for wireless terminal 20 when not needed. Activation provides therefore the possibility to configure multiple component carriers for wireless terminal 20, but only activate these additional component carriers—referred to here as "secondary component carriers"—on an as-needed basis. Often, wireless terminal 20 may have one or a very few component carriers activated, thereby permitting wireless terminal 20 to use a lower reception bandwidth and thus reduce battery consumption.

In many advanced communication systems, scheduling of component carriers is done via downlink assignments, uplink scheduling grants, and/or other scheduling information that is communicated in messages (represented in FIG. 2 by "downlink control messages 70") sent to wireless terminal 20 over a downlink control channel. For example, in an embodiment of mobile communication system 10 implementing LTE, downlink assignments would be communicated to wireless terminal 20 in Downlink Control Information (DCI) messages transmitted on the PDCCH. This scheduling information indicates that wireless terminal 20 has been scheduled to receive a downlink transmission on a particular component carrier during a particular radio subframe. For example, in embodiments of mobile communication system 10 that implement LTE, base station 32 may transmit a downlink control message 70 that includes one or more downlink scheduling assignments indicating when in the current or upcoming subframe wireless terminal 20 is scheduled to receive a data transmission on the Physical Downlink Shared CHannel (PDSCH) on a particular component carrier or carriers.

Wireless terminal 20 determines the component carrier associated with received scheduling information either based on a predetermined relationship between the component carrier on which the scheduling information was received (e.g., the relevant component carrier may be the same component carrier on which the scheduling information was received for a downlink assignment or an uplink component carrier associated with that downlink component carrier for uplink scheduling grants) or based on additional information included in the downlink control message 70 that identifies the relevant component carrier (such as a Carrier Indicator Field (CIF) in LTE embodiments). In particular embodiments, the applicable subframe for the scheduling information is the same subframe in which the downlink control message 70 is transmitted, or another subframe identified by wireless terminal 20 based on some pre-established relationship with the subframe in which downlink control message 70 was transmitted.

In addition to the scheduling information, downlink control messages 70 may contain, in particular embodiments, modulation and coding scheme parameters, spatial multiplexing parameters, and feedback-related information. Additionally, in particular embodiments, control messages may include power control parameters (e.g., Transmit Power Control (TPC) commands), as discussed further below. These parameters provide information indicating how wireless terminal 20 should respond to the downlink control message 70 or how wireless terminal 20 should behave when using the scheduled resource.

In many advanced communication technologies, wireless terminal 20 is expected to respond to a downlink control message 70 by indicating whether the data transmission(s) scheduled by the relevant downlink control message 70 were successfully received (including both reception and decoding of the relevant transmissions without error). Thus, in particular embodiments, wireless terminal 20 responds to a detected downlink control message 70 by communicating an uplink control message 72 that includes feedback information (e.g., Hybrid Automatic Repeat Request (HARQ) Acknowledgement/Negative Acknowledgement (ACK/NACK) feedback bits) indicating successful receipt or unsuccessful receipt/non-receipt of the transmission(s) scheduled by that downlink control message 70. However, when carrier aggregation is implemented in a network, particularly one supporting legacy terminals unable to utilize multiple component carriers, the configuration and communication of uplink control messages 72 can become far more complicated. Communication of feedback for a significant number of different component carriers can waste value transmission resources. Additionally, the dramatic increase in the number of possible configuration and scheduling scenarios can create problems if the communication of this information is not robust. Therefore, particular embodiments of mobile communication system 10 implement certain solutions for improved communication of control signaling in carrier aggregation systems.

In particular embodiments, wireless terminal 20 is configured by the network to make scheduling requests (SR) with a pre-determined frequency. When a wireless terminal 20 is to feed back bits in a subframe that allows scheduling request, the SR bit (where, e.g., "1" may represent a positive scheduling request and "0" may represent a negative scheduling request) can be appended to the feedback bit sequences. Thus, uplink control message 72 may also include an SR bit or an other form of scheduling request in addition to the feedback bits.

Format Selection for Uplink Control Messages

If wireless terminal 20 has multiple component carriers activated at a particular moment, it may be necessary for wireless terminal 20 to provide feedback on transmissions scheduled on multiple different component carriers at once. In particular embodiments of mobile communication system 10, wireless terminal 20 may be configured to use a single uplink control message 72 to acknowledge receipt or non-receipt/failed receipt of scheduled information on all scheduled component carriers during a particular subframe. By consolidating the acknowledgements in this manner, mobile communication system 10 may reduce the overhead required for such acknowledgements. However, legacy terminals served by mobile communication system 10 may only be capable of using (and therefore acknowledging) a single component carrier. As a result, it may be necessary for mobile communication system 10 to recognize multiple formats of uplink control message 72, including a first format for devices capable of utilizing only a single component carrier, a format that only provides feedback for a single component carrier (referred to here as the "single carrier" or "SC" format), and a second format that can be used to communicate feedback for multiple component carriers (referred to here as the "carrier-aggregation" or "CA" format).

In particular embodiments, the second format represents a message format that defines, within an uplink control message 72, predetermined locations for one or more feedback bits associated with each of the component carriers currently configured for use in cell 60. The specific number of bits transmitted for each component carrier may vary. For example, in particular embodiments, mobile communication system 10 supports multiple-input multiple-output (MIMO) and spatial diversity transmission schemes and may selectively utilize spatial feedback bundling. In such embodiments, wireless terminal 20 may be configured to use a CA format that provides one feedback bit per configured component carrier when spatial feedback bundling is employed, and provides two feedback bits per configured component carrier when spatial bundling is not employed. For example, if cell 60 is currently configured with three component carriers, this CA format would support three bits when spatial feedback bundling is employed and six bits when spatial feedback bundling is not employed. Unneeded feedback bits (e.g., those associated with a component carrier for which no scheduling information was successfully received, or those associated with a single-codeword transmission that requires only one of an allotted two feedback bits) may be set to a fixed value, e.g., "0" (NACK). In general, however, the CA format may indicate in any appropriate manner whether scheduled information for each of a plurality of component carriers has or has not been successfully received by wireless terminal 20.

Because of the additional overhead associated with using the CA format, it may be desirable to have terminals that are capable of utilizing multiple component carriers also use the SC format for uplink control messages 72 if such terminals have only been scheduled on a single component carrier (and, thus, only need to provide feedback on a single component carrier). Therefore, in particular embodiments, wireless terminal 20 transmits uplink control messages 72 in accordance with the SC format when providing feedback regarding a transmission wireless terminal 20 is scheduled to receive on a single component carrier (e.g., the primary component carrier) and in accordance with the CA format when providing feedback on transmissions wireless terminal 20 is scheduled to receive on multiple component carriers. Consequently, particular embodiments of mobile communication system 10 may reduce the overhead associated with control information transmissions by wireless terminals 20 that support carrier aggregation.

However, because access network 30 may communicate downlink control messages 70 over non-ideal radiofrequency (RF) channels, downlink control messages 70 carrying assignments and scheduling grants may not be received or may be corrupted during transmission, resulting in errors when decoded by wireless terminal 20. As a result, wireless terminal 20 may not receive all of the downlink control messages 70 transmitted to it for a particular subframe. One particular concern is that wireless terminal 20 may receive a downlink control message 70 with scheduling information for a secondary component carrier, but fail to receive the downlink control message 70 with scheduling information for the primary component carrier during the same subframe. In such cases, using the SC format to provide feedback on the downlink control message 70 for the secondary component carrier could lead to errors, because the SC format uplink control message 72 only provides feedback on a single component carrier. Because, in this case, multiple component carriers have been scheduled for wireless terminal 20, access network 30 may not be able to conclusively determine which of the scheduled component carriers the feedback was associated with.

Consequently, in particular embodiments, wireless terminal 20 is configured to select a format for uplink control messages 72 based on whether wireless terminal 20 receives scheduling information for any secondary component carrier associated with cell 60. In particular embodiments, wireless terminal 20 knows which component carrier is the primary component carrier (for example, as a result of information transmitted by base station 32 during configuration of the component carriers) or is able to determine from the format of a received downlink control messages 70 whether the corresponding component carrier is the primary or a secondary component carrier. If wireless terminal 20 successfully receives scheduling information for any secondary component carrier, wireless terminal 20 responds with a CA format uplink control message 72, even if this secondary component carrier is the only component carrier for which wireless terminal 20 successfully receives scheduling information for that subframe. By doing so, in particular embodiments, wireless terminal 20 is able to prevent errors that would otherwise result if wireless terminal 20 used the SC format to provide feedback on secondary component carriers when wireless terminal 20 has not successfully received scheduling information transmitted for the primary component carrier. In such embodiments, wireless terminal 20 may still use the SC format to transmit feedback when wireless terminal 20 the only component carrier for which wireless terminal 20 receives scheduling information is the primary component carrier, just not when a secondary component carrier is the only component carrier for which scheduling information is received.

Figure 7:
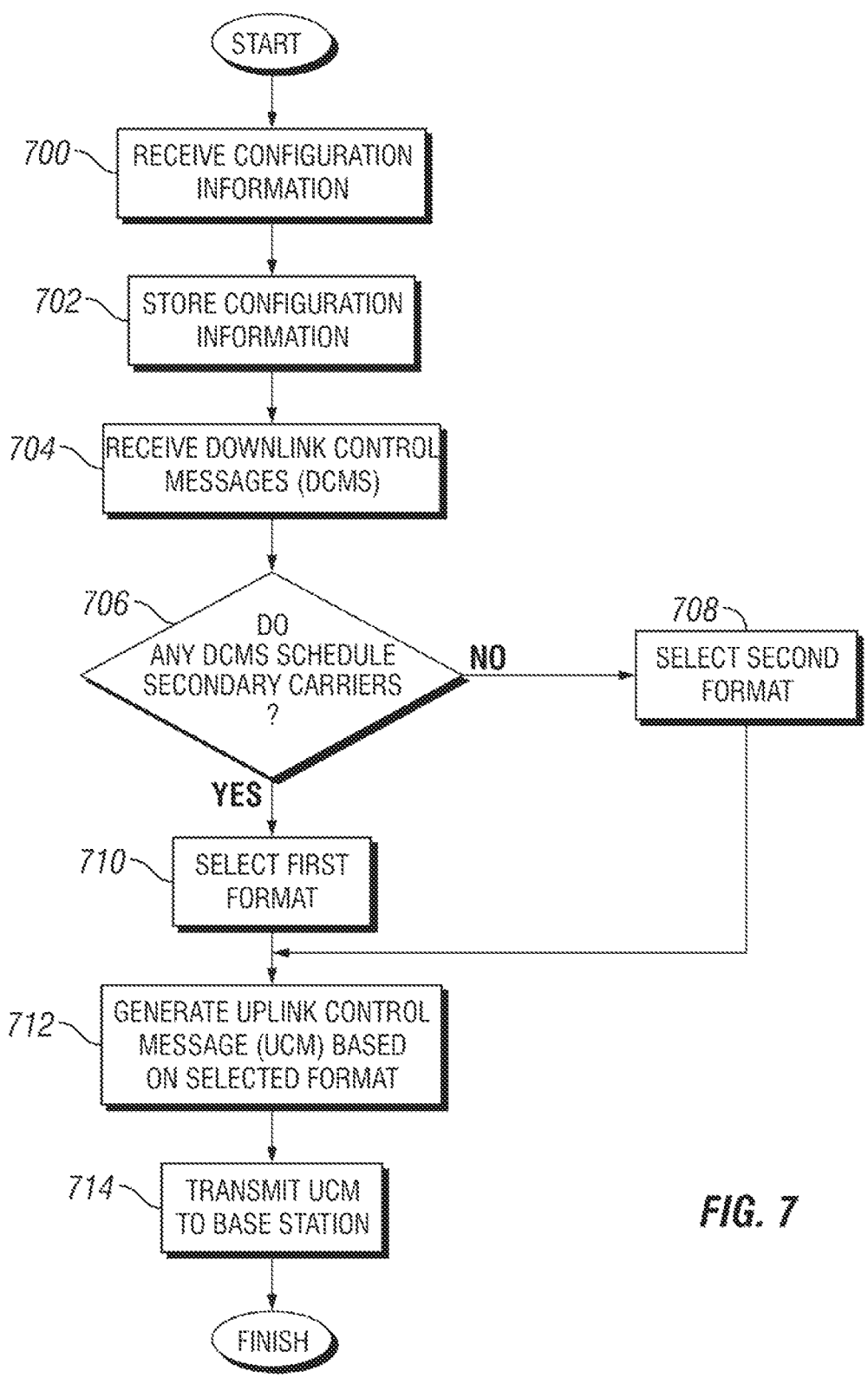
FIG. 7 is a flowchart showing example operation of a particular embodiment of the wireless terminal in selecting a format for uplink control messages.

In general, this solution permits access network 30 to conclusively establish, when receiving an uplink control message 72 with feedback information for only a single component carrier (i.e., an SC format message), that the feedback information relates to a scheduled transmission on the primary component carrier. Furthermore, in particular embodiments of mobile communication system 10, access network 30 is configured to always schedule wireless terminal 20 on the primary component carrier first. In such embodiments, wireless terminal 20 may often be scheduled on only the primary component carrier. As a result, wireless terminal 20 may still be able to use the SC format often, limiting the frequency with which the CA format, with its additional overhead, is used. Thus, particular embodiments of mobile communication system 10 permit wireless terminal 20 to opportunistically use the SC format to reduce the control signaling overhead associated with carrier aggregation, but at the same time avoid certain errors that may result when scheduling information is unsuccessfully transmitted. FIG. 7 below describes in greater detail example operation of a particular embodiment of wireless terminal 20 capable of providing feedback in this manner.

Communicating Power Control Parameters

Particular embodiments of mobile communication system 10 may also or alternatively provide a more reliable technique for controlling the transmission power of terminals when sending uplink control messages 72 associated with carrier aggregation. In particular embodiments of mobile communication system 10, each downlink assignment or uplink grant is scheduled with its own downlink control message 70 and each received uplink control message 72 contains a power control parameter that indicates directly or indirectly a transmission power level for wireless terminal 20 to use in transmitting the responsive uplink control message 72. These power control parameters may represent information indicating a specific transmission power level for wireless terminal 20 to use, information indicating a maximum transmission power level wireless terminal 20 must obey, information indicating an adjustment for wireless terminal 20 to apply to a current transmission power level, or information indicating in any other manner an appropriate transmission power level for wireless terminal 20. As one example, in certain LTE embodiments, each downlink control message 70 contains a Transmit Power Control (TCP) bit field that contains an adjustment value for wireless terminal 20 to apply to a current power level in determining an appropriate transmission power level at which to transmit a responsive uplink control message 72 on the PUCCH.

As explained above, when scheduled for transmission on the primary component carrier as well as one or more secondary component carriers, wireless terminal 20 will receive multiple downlink control messages 70, one for each component carrier on which the terminal is scheduled. In such embodiments, it would be possible to only transmit the desired power control parameter in one downlink control message 70 and reuse the relevant fields in other downlink control messages 70 for other, non-redundant control information.

However, doing so can create several problems. First, if the power control parameter were inserted into only a single downlink control message 70 transmitted to wireless terminal 20 and wireless terminal 20 does not successfully receive that downlink control message 70, wireless terminal 20 might not have sufficient information by which to determine the correct transmission power to use in transmitting the responsive uplink control message 72. Second, even if wireless terminal 20 were to receive the downlink control message 70 containing the true power control parameter, access network 30 would be unlikely to find a single power control parameter suitable for use with both the SC format and the CA format, as these two formats may result in drastically different uplink transmissions.

Furthermore, in particular embodiments, the CA format provides feedback for all configured component carriers. Since re-configuration is a rather slow process, the number of configured component carriers cannot track the actually used component carriers and often a rather high number of component carriers is configured for a given cell 60. Therefore, it is quite likely that, for a given subframe, cell 60 will be configured with more component carriers than wireless terminal 20 will actually be scheduled to use. This may result in a yet a third problem. Wireless terminal 20 may transmit feedback bits that would be unnecessary if wireless terminal 20 provided feedback for only activated or scheduled component carriers. This in turn results in lower energy per true feedback bit and worse performance.

To address the third problem (i.e., diminished performance resulting from the transmission of more feedback bits than are necessary), particular embodiments of base station 32 implement a dynamic decoding scheme to decode feedback bits transmitted by wireless terminal 20 after receiving these downlink control messages 70. This dynamic decoding scheme utilizes scheduling knowledge to improve the base station's decoding performance for a given transmission power level. As a result, the dynamic decoding can provide the same quality level with a substantial reduction in the signal-to-noise ratio, thereby reducing the negative impact of the unnecessary feedback bits. This dynamic decoding scheme is described in greater detail below.

To address the first and second problems, an appropriate element of access network 30 (assumed here to be base station 32) may be configured to determine a power control parameter to include in each downlink control message 70 based on whether the relevant downlink control message 70 is communicating scheduling information for the primary component carrier, a "PCC control message" (represented in FIG. 2 by downlink control message 70a), or communicating scheduling information for one of the secondary component carriers, an "SCC control message" (represented in FIG. 2 by downlink control messages 70b-d). In particular embodiments, if the relevant downlink control message 70 is a PCC downlink control message, base station 32 selects a first power control parameter suitable for use in transmitting an uplink control message 72 in accordance with the SC format. If, instead, the relevant downlink control message 70 is an SCC control message, then base station 32 determines a second power control parameter or multiple power control parameters suitable for wireless terminal 20 to use in transmitting a responsive uplink control message 72 in accordance with the CA format.

Base station 32 may determine this second and/or any additional power control parameter for use with the CA format in any suitable manner. As one example, in particular embodiments, base station 32 determines a second power control parameter for transmitting uplink control message 72 using the CA format regardless of how many or which downlink control messages 70 wireless terminal 20 receives. In such embodiments, base station 32 may then include this second power control parameter in each of SCC downlink control messages 70b-d. This may ensure that wireless terminal 20 will use the same transmission power regardless of how many of the multiple SCC downlink control messages 70b-d wireless terminal 20 successfully receives.

As another example, the second power control parameter determined by base station 32 may represent a power control parameter for use when wireless terminal 20 successfully receives all of the SCC downlink control messages 70 transmitted to wireless terminal 20 for that subframe. Base station 32 may intend for wireless terminal 20 to calculate an actual power control parameter to use based on this second power control parameter and on the number of SCC downlink control messages 70 that wireless terminal 20 successfully receives. As a result, base station 32 may calculate a third power control parameter by dividing the second power control parameter by the number of secondary component carriers on which wireless terminal 20 is being scheduled in this subframe. Base station 32 may then include this third power control parameter in each SCC downlink control message 70b-d. Alternatively, base station 32 may calculate multiple, different additional power control parameters—one for each SCC downlink control message 70b-d to be transmitted—that add up to the second power control parameter. Base station 32 then includes one of these additional power control parameters in each SCC downlink control message 70b-d transmitted. If wireless terminal 20 then successfully receives some or all of the transmitted SCC downlink control messages 70b-d, wireless terminal 20 will add the power control parameters in the received SCC downlink control messages 70b-d (with carrier-specific weightings in certain embodiments) to get a power control parameter for use in making a CA format transmission in the subframe.

As yet another example, base station 32 may determine a second and/or additional power control parameters based on the specific set of secondary component carriers on which wireless terminal 20 is scheduled to receive a transmission during the subframe. To illustrate, FIGS. 3A-3D provide tables containing example power control parameters for an embodiment in which base station 32 is capable of supporting five different component carriers. Specifically, the tables of FIGS. 3A-3D describe example power control parameters for a particular embodiment of base station 32 when two, three, four, or five component carriers, respectively, are configured for wireless terminal 20. In particular, FIGS. 3A-3D illustrate example power control parameters for an embodiment in which wireless terminal 20 determines a transmission power level for transmitting uplink control messages 72 in accordance with Equation 1:

$$P_{PUCCH}(i) = \min\{P_{CMAX}, P_{0\_PUCCH} + PL + h(n_{CQI}, n_{HARQ}) + \Delta_{F\_PUCCH}(F) + g(i)\} \quad (1)$$

for which the following definitions are used:

$P_{PUCCH}(i)$ PUCCH transmit power for subframe i.

$P_{CMAX}$ Configured maximum transmit power for uplink PCC.

$P_{0\_PUCCH}$ Desired uplink control message receive power signaled by higher layers.

$h(n_{CQI}, n_{HARQ})$ Offset parameter that depends on number of CQI bits or number $n_{CQI}$ of CQI bits or number $n_H$ of feedback bits $\Delta_{F\_PUCCH}(F)$ Offset parameter that depends on uplink control message format g(i) Accumulated power adjustment value derived from power control parameters. $\delta_{PUCCH}(i)$. In particular embodiments, $$g(i) = g(i) + \sum_{m=0}^{M-1} \delta_{PUCCH}(i - k_m)$$

The values M and $k_m$ depend on whether the duplexing mode is FDD or TDD.

PL Pathloss

Base station 32 may store lookup tables containing the same or similar information to that shown in FIG. 3A-3D. Additionally, base station 32 may maintain multiple different versions of each lookup table to use under different radio conditions, with difference carrier configurations, or in response to changes in other aspects of the operating environment. In such embodiments, base station 32 selects an appropriate second power control parameter using such lookup tables. Base station 32 then includes the selected second power control parameter in each of the SCC downlink control messages 70b-d transmitted to wireless terminal 20. Alternatively, base station 32 may, as described above, calculate a third power control parameter and/or additional power control parameters for inclusion in the SCC downlink control messages 70 based on the selected second power control parameter.

As yet another example, in particular embodiments, base station 32 may determine the second power control parameter (or any additional power control parameter to be included in SCC downlink control messages 70) based on whether spatial feedback bundling will be employed by wireless terminal 20. For example, any of the above described techniques for generating additional power control parameters can be modified to further consider whether spatial feedback bundling will be employed. This may permit the transmission power to be adjusted based on the number of feedback bits that will actually be transmitted.

Base station 32 then transmits any generated downlink control messages 70 to wireless terminal 20. Wireless terminal 20 successfully receives (i.e., receives and decodes without error) some or all of the transmitted downlink control messages 70. Based on the successfully received downlink control messages 70, wireless terminal 20 determines a transmission power level to use when transmitting the responsive uplink control message 72. If wireless terminal 20 successfully receives only PCC downlink control message 70a, wireless terminal 20 will determine a transmission power level for transmitting a responsive uplink control message 72 using the power control parameter in the only downlink control message 70 successfully received by wireless terminal 20 (in this case, the first power control parameter). If wireless terminal 20 successfully receives any of SCC downlink control messages 70b-d, then wireless terminal 20 will instead determine a transmission power level to use based on power control parameters in one or all of the successfully received SCC downlink control messages 70b-d (i.e., the second or additional power control parameters). As explained above, wireless terminal 20 may determine the overall power control parameter to use based on a common power control parameter that is included each of the successfully received SCC downlink control message 70b-d, based on the sum (possibly weighted) of the power control parameters included in the successfully received SCC downlink control messages 70b-d, or based on any appropriate combination of the power control parameters in one or more of the successfully received SCC downlink control messages 70b-d.

Thus, wireless terminal 20 uses the first power control parameter (i.e., the power control parameter included in the downlink control message 70 scheduling wireless terminal to receive transmissions on the primary component carrier) when base station 32 has only scheduled wireless terminal 20 to receive transmissions on the primary component carrier, or when wireless terminal 20 does not successfully receive downlink control messages 70 communicating the scheduling of any secondary component carriers. If, however, wireless terminal 20 successfully receives any downlink control messages 70 scheduling wireless terminal 20 to receive transmissions on a secondary component carrier, then wireless terminal 20 will disregard the first power control parameter and determine the appropriate transmission power level based on the power control parameters in one or more of the downlink control messages 70 scheduling such secondary component carriers.

After determining the power control parameter or parameters to use based on the successfully received downlink control messages 70, wireless terminal 20 will calculate a transmission power for its uplink control message 72 based on this power control parameter. Wireless terminal 20 may determine the transmission power in any appropriate manner based on the power control parameters communicated by base station 32 in downlink control messages 70. For example, in particular embodiments, wireless terminal 20 is configured to determine a transmission power level for the downlink control message 70 based on Equation (1).

In particular embodiments that utilize Equation (1), g(i) is the accumulation of the current power control parameter (or the (weighted) sum of power control parameters successfully received in downlink control messages 70 scheduling secondary component carriers) and previous values. Depending on whether the relevant power control parameters are used to maintain a single g(i) value or two independent g(i) values—one for the SC format ($g_{PCC}(i)$) and one for the CA format ($g_{SCC}(i)$)—such embodiments may utilize separate power control loops for the different formats.

In the first case where only one a single g(i) value is maintained, this g(i) is only updated with the power control parameter related to the format to be used for the responsive uplink control message 72. Thus, whenever the SC format is used, g(i) is updated based on the power control parameter transmitted in the PCC downlink control messages 70 (i.e., the first power control parameter), assuming the PCC downlink control message 70 was successfully received. Whenever the CA format is used, g(i) is updated based on one or more of the power control parameters in successfully received downlink control messages 70 scheduling secondary component carriers.

In the second case, $g_{PCC}(i)$ for the SC format is only updated with power control parameter from PCC downlink control message 70. Meanwhile, $g_{SCC}(i)$ for the CA format is only updated based on power control parameters in downlink control messages 70 scheduling secondary component carriers. In various embodiments, both $g_{PCC}(i)$ and $g_{SCC}(i)$ may be updated as soon as a corresponding power control parameter is received or may only be updated if the corresponding format for uplink control messages 72 is also used (i.e., $g_{PCC}(i)$) is only updated if the SC format is used and $g_{SCC}(i)$ is only updated if the CA format is used).

After determining the appropriate transmission power level, wireless terminal 20 then transmits an uplink control message 72 for the subframe to base station 32 in accordance with a selected format and using the calculated transmission power level. By using the described techniques to communicate the appropriate transmission power level for the relevant uplink control message 72, mobile communication system 10 can, in particular embodiments, facilitate the use of different transmission power levels for different control message formats but, at the same time, minimize the impact that transmission errors in communicating downlink control messages 70 have on the selection of appropriate transmission power levels.

Dynamic Decoding of Uplink Control Messages

As noted above, particular embodiments of mobile communication system 10 utilize dynamic decoding of feedback bits in uplink control messages 72 to improve decoding performance. More specifically, particular embodiments utilize knowledge of the scheduled component carriers for wireless terminal 20 to improve link reliability and/or reduce the transmission power requirements for uplink control messages 72.

As part of this dynamic decoding scheme, base station 32 receives uplink control messages 72 from wireless terminal 20 that have been encoded for transmission over the radio link between wireless terminal 20 and base station 32. The following description assumes, for purposes of illustration, that wireless terminal 20 encodes feedback information in uplink control messages 72 using a (32, O) Reed Muller encoding scheme, where O is the number of feedback bits. Nonetheless, wireless terminal 20 may use any suitable encoding scheme with appropriate modification of the described decoding techniques. Additionally, the following description assumes, for purposes of illustration, that two feedback bits are transmitted for each component carrier on which a terminal is scheduled. In alternative embodiments, the number of bits in the feedback information may vary depending on, for example, whether spatial bundling is employed or whether certain component carriers are configured to only be used for single-codeword transmissions.

Thus, in particular embodiments, wireless terminal 20 encodes the feedback bits using the (32, O) block code. In particular embodiments, the code words of this block code are a linear combination of the eleven (11) basis sequences denoted $M_{i,n}$ and defined in Table 5.2.2.6.4-1 of 3GPP TS 36.212, "Multiplexing and channel coding," V 9.0.0, which is incorporated herein by reference in its entirety. The encoded block is denoted by $b_0, b_1, b_2, b_3, \ldots, b_{B-1}$ where B=32 and:

$$b_i = \sum_{n=0}^{O-1} (o_n \cdot M_{i,n}) \bmod 2 \quad \text{Equation (2)}$$

where i=0, 1, 2, ..., B−1.

The encoded block may then be processed as appropriate for the relevant configuration of mobile communication system 10 before being transmitted by wireless terminal 20. For instance, in certain LTE embodiments, rate matching is performed on the encoded bits to generate a 48-bit encoded sequence for transmission as part of a Discrete Fourier Transform Spread Orthogonal Frequency Division Multiplexed (DFTS-OFDM) based PUCCH. The encoded bit sequence is then scrambled with cell-specific and/or symbol-dependent sequences. Two 24 bit groups are each assigned to a separate slot and converted into twelve quadrature phase-shift keying (QPSK) symbols, DFT precoded, spread across five DFTS-OFDM symbols, and transmitted within one resource block (bandwidth) and five DFTS-OFDM symbols (time).

Base station 32 receives the encoded feedback information as part of an uplink control message 72. Base station 32 then decodes the encoded feedback information using knowledge of scheduling information associated with wireless terminal 20 to facilitate decoding. To illustrate, consider an example in which base station 32 has scheduled two component carriers (Component Carrier 3 and Component Carrier 4) out of five configured component carriers for transmissions to wireless terminal 20 during a particular subframe and in which wireless terminal 20 uses two feedback bits to report on each configured component carrier. Since the codebook used in this example would be configured to support ten feedback bits, wireless terminal 20 will use ten Reed Muller bases with indices {0, 1, 2, 3, 4, 5, 6, 7, 8, 9} to encode the five configured component carriers in this case. That is, a nominal (48, 10) channel code is used by wireless terminal 20.

Because, in this example, base station 32 has not sent any assignments or scheduling grants relating to Component Carrier 0, Component Carrier 1, or Component Carrier 2, the ten-bit sequence of feedback bits should start with six zeros. Therefore base station 32 using its knowledge of this scheduling information can decode an effective (48, 4) channel code using only the Reed Muller bases with indices {6, 7, 8, 9}. For this example, this knowledge effectively reduces the number of possible codewords to search from 1024 to only 16. As a result, the required operating signal-to-noise ratio (SNR) can be reduced, and the transmission power used by wireless terminal 20 in transmitting feedback information can likewise be reduced. For instance, in the case of five configured component carriers, dynamic decoding can reduce the necessary transmission power increase on wireless terminal 20 when transmitting CA format uplink control messages 72 from 4 dB down to no increase in most cases and a small increase in a minority of cases. The required small transmission power increase for the minority cases can be added to power control parameters in downlink control messages 70 scheduling secondary component carriers to inform wireless terminal 20.

Therefore, in particular embodiments of mobile communication system 10, base station 32 utilizes an improved maximum likelihood decoding scheme to decode the first order Reed-Muller-code encoded feedback information in uplink control messages 72 based on knowledge of the scheduling information that prompted the feedback information. In particular embodiments of mobile communication system 10, this decoding scheme comprises a first decoding algorithm used for uplink control messages 72 that include up to six feedback bits and a second decoding algorithm used for uplink control messages 72 that include more than six feedback bits.

More specifically, the first decoding algorithm provides an efficient technique for dynamic decoding of CA format uplink control messages 72 supporting up to six feedback bits (i.e., O≤6). As noted above, in particular embodiments, wireless terminal 20 uses an LTE (32, O) block code related to the first order (32, 6) Reed-Muller code to encode feedback bits in uplink control messages 72. For example, when wireless terminal 20 encodes an uplink control message 72 for a cell 60 supporting five configured component carriers and employing spatial bundling (i.e., an uplink control message 72 that includes five bits of feedback information), the LTE (32, 5) block code is used for forward error correction. A brute-force maximum likelihood (ML) decoding of this code would require 32×32=1024 operations. Using the first decoding algorithm, an efficient decoding can be completed in particular embodiments of mobile communication system 10 in only 32×$\log_2$32=160 operations.

In particular embodiments, this first decoding algorithm is implemented by:
  1. Applying the interleaving shown in Equation (3) to the received soft value sequence, $r_0, r_1, r_2, r_3, \ldots, r_{31}$ corresponding to the LTE (32, O) block code to convert the received soft value sequence into a received vector, $s_0, s_1, s_2, s_3, \ldots, s_{31}$, corresponding to the first order (32,6) Reed-Muller code:

$$s_0 = r_{31}, s_{16} = r_{19}$$
$$s_1 = r_0, s_{17} = r_{25}$$
$$s_2 = r_{20}, s_{18} = r_{10}$$
$$s_3 = r_1, s_{19} = r_{11}$$
$$s_4 = r_2, s_{20} = r_{12}$$
$$s_5 = r_{21}, s_{21} = r_{13}$$
$$s_6 = r_3, s_{22} = r_{26},$$
$$s_7 = r_4, s_{23} = r_{27}$$
$$s_8 = r_{22}, s_{24} = r_{14}$$
$$s_9 = r_5, s_{25} = r_{15}$$
$$s_{10} = r_6, s_{26} r_{28}$$
$$s_{11} = r_{23}, s_{27} = r_{16}$$
$$s_{12} = r_7, s_{28} = r_{17}$$
$$s_{13} = r_8, s_{29} = r_{18}$$
$$s_{14} = r_9, s_{30} = r_{29}$$
$$s_{15} = r_{24}, s_{31} = r_{30} \quad \text{Equation (3)}$$

2. Perform a fast Hadamard transform on the received vector $s_0, s_1, s_2, s_3, \ldots, s_{31}$ to obtain the transformed values $h_0, h_1, h_2, h_3, \ldots, h_{31}$.
3. Find the index and the sign of the transformed value with the largest absolute value from a subset of the transformed values. The subset is determined by the set of known information bits.
4. Obtain an information bit sequence estimate based on the index of the best transformed value and its sign.

To illustrate this technique, consider a first example where base station 32 has scheduled wireless terminal 20 to use all five currently-configured component carriers. In this case, the set of known information bits would be $[o_5]=[0]$, because Component Carrier 5 is not configured and thus is not scheduled. Suppose the actual feedback bit sequence generated by wireless terminal 20 is [1, 1, 0, 0 1] for the five configured component carriers, indicating that wireless terminal 20 successfully received scheduled transmissions on Component Carrier 0, Component Carrier 1, and Component Carrier 4. In an embodiment using the example encoding scheme described above, wireless terminal 20 would then produce a corresponding first-order Reed-Muller encoded codeword of [1, 0, 1, 0, 1, 0, 1, 0, 0, 1, 0, 1, 0, 1, 0, 1, 1, 0, 1, 0, 1, 0, 1, 0, 0, 1, 0, 1, 0, 1, 0, 1] and transmit the codeword to base station 32 as part of an uplink control message 72.

Base station 32 receives the transmitted uplink control message 72 and may then perform the interleaving described by Equation (3) on the soft value sequence corresponding to the feedback bits to generate a received vector, $s_0, s_1, s_2, s_3, \ldots, s_{31}$. Suppose that, because of interference and noise in the wireless communication channel, the received vector, $s_0, s_1, s_2, s_3, \ldots, s_{31}$, for this example is given by (−0.8, 0.5, −0.9, 0.7, −0.8, 1.4, −1.1, 0.1, 1.2, −0.3, 1.4, −1.8, 0.9, −1.4, 0.5, −1.5, −0.9, 0.7, −1.0, 0.9, −1.3, 1.1, −0.6, 2.0, 0.4, −1.6, 1.5, −1.2, 0.3, −0.7, 1.7, −0.8]. The resulting Hadamard transformed values for this example are shown on the left-hand side of the following Equation (4):

| | Positive | | Negative |
|---|---|---|---|
| $h_0 = -1.3 \rightarrow$ | 000000 | or | 100000 |
| $h_1 = 2.3 \rightarrow$ | 010000 | or | 110000 |
| $h_2 = -1.3 \rightarrow$ | 001000 | or | 101000 |
| $h_3 = -3.8 \rightarrow$ | 011000 | or | 111000 |
| $h_4 = -1.1 \rightarrow$ | 000100 | or | 100100 |
| $h_5 = 3.6 \rightarrow$ | 010100 | or | 110100 |
| $h_6 = 0.7 \rightarrow$ | 001100 | or | 101100 |
| $h_7 = -0.0 \rightarrow$ | 011100 | or | 111100 |
| $h_8 = 1.3 \rightarrow$ | 000010 | or | 100010 |
| $h_9 = -32.0 \rightarrow$ | 010010 | or | 110010 |
| $h_{10} = 0.7 \rightarrow$ | 001010 | or | 101010 |
| $h_{11} = 3.6 \rightarrow$ | 011010 | or | 111010 |
| $h_{12} = -2.0 \rightarrow$ | 000110 | or | 100110 |
| $h_{13} = 0.7 \rightarrow$ | 010110 | or | 110110 |
| $h_{14} = -0.8 \rightarrow$ | 001110 | or | 101110 |
| $h_{15} = 2.7 \rightarrow$ | 011110 | or | 111110 |
| $h_{16} = -2.2 \rightarrow$ | 000001 | or | 100001 |
| $h_{17} = 3.1 \rightarrow$ | 010001 | or | 110001 |
| $h_{18} = 7.7 \rightarrow$ | 001001 | or | 101001 |
| $h_{19} = -0.3 \rightarrow$ | 011001 | or | 111001 |
| $h_{20} = 4.8 \rightarrow$ | 000101 | or | 100101 |
| $h_{21} = -1.9 \rightarrow$ | 010101 | or | 110101 |
| $h_{22} = -2.1 \rightarrow$ | 001101 | or | 101101 |
| $h_{23} = -1.3 \rightarrow$ | 011101 | or | 111101 |
| $h_{24} = -1.1 \rightarrow$ | 000011 | or | 100011 |
| $h_{25} = 1.5 \rightarrow$ | 010011 | or | 110011 |
| $h_{26} = -1.4 \rightarrow$ | 001011 | or | 101011 |
| $h_{27} = -2.2 \rightarrow$ | 011011 | or | 111011 |
| $h_{28} = -2.0 \rightarrow$ | 000111 | or | 100111 |
| $h_{29} = -0.1 \rightarrow$ | 010111 | or | 110111 |
| $h_{30} = -4.2 \rightarrow$ | 001111 | or | 101111 |
| $h_{31} = 4.2 \rightarrow$ | 011111 | or | 111111 | Eq. (4) |

In Step 3, the index and the sign of the transformed value with the largest absolute value from a subset of the transformed values is found. Since the set of known information bit is $[o_5]=[0]$, the search should be limited to $h_b$ with $b \in \{0, 1, 2, 3, 4, 5, 6, 7, 8, 9, 10, 11, 12, 13, 14, 15\}$, the indices for the candidates corresponding to $[o_5]=[0]$—that is, the indices for all candidates having a "0" for the final bit. For this example, $h_9$ has the largest absolute value in that subset and it's sign is negative. As indicated by the right-hand side of Equation (4), each of the Hadamard transformed values ($h_b$) is associated with a bit sequence. In the example embodiment, each of the transformed values is associated with a six-bit sequence that comprises a five-bit binary representation of the index of the relevant transformed value (in the second through sixth bits, with the sixth bit being the most significant of the five-bit representation) and an additional bit (the first bit) that corresponds to the sign of the transformed value (with a negative transformed value mapping to a first bit of "1" and a positive transformed value mapping to a first bit of "0"). Thus, for this example embodiment, $h_9$ having the greatest magnitude and a positive value corresponds to a bit sequence estimate of [1 0 0 1 0] for the original, unencoded feedback information. Since base station 32 knows that $[o_5]=[0]$ in this example, base station 32 can determine that the estimated feedback bit sequence [1 1 0 0 1 0] corresponds to a transmitted feedback sequence of [1 1 0 0 1]. Thus, base station 32 is able to recover the original feedback information sent by wireless terminal 20.

Consider a second example where base station 32 schedules Component Carrier 0, Component Carrier 1, Component Carrier 2, and Component Carrier 4. In this case, the subset of known information bits is $[o_3,o_5]=[0,0]$, based on the fact that Component Carrier 3 has not been scheduled for wireless terminal 20 and Component Carrier 5 is not configured.

Therefore, the search subset for Step 3 is limited to $h_b$ with $b \in \{0, 1, 2, 3, 8, 9, 10, 11\}$, the indices for the candidate bit sequences for which $[o_3, o_5] = [0, 0]$.

Consider a third example where base station 32 schedules Component Carrier 0, Component Carrier 1, and Component Carrier 4. In this case, the subset of known information bits is $[o_2, o_3, o_5] = [0, 0, 0]$, based on the fact that Component Carrier 2, Component Carrier 3, and Component Carrier 5 have not been scheduled. Therefore, the search subset for step 3 is limited to $h_b$ with $b \in \{0, 1, 8, 9, 11\}$, the indices for the candidate bit sequences for which $[o_2, o_3, o_5] = [0, 0, 0]$.

As noted above, particular embodiments of mobile communication system 10 may utilize a second algorithm for decoding feedback bits in uplink control messages 72 containing more than six feedback bits. In particular embodiments, wireless terminal 20 uses an LTE (32, O) block code related to the second order (32, 16) Reed-Muller code to encode this feedback information. For example, in such embodiments, a CA format uplink control message 72 that provides feedback on five configured component carriers (without employing spatial bundling) contains ten feedback bits, and wireless terminal 20 uses the LTE (32,10) block code for forward error correction encoding. Wireless terminal 20 then transmits the encoded uplink control message 72 to base station 32.

By utilizing the second algorithm, particular embodiments of base station 32 may perform decoding of feedback information in such an uplink control message 72 with substantially lower complexity.

According to this second algorithm, base station 32 decodes feedback bits by:

1. Applying the interleaving shown in Equation (3) on the received soft value sequence $r_0, r_1, r_2, r_3, \ldots, r_{31}$ corresponding to the LTE (32, O) block code into a received vector $s_0, s_1, s_2, s_3, \ldots, s_{31}$ corresponding to the second order (32,10) Reed-Muller code.
2. Forming a set of hypothesized sequences for $[o_6, o_7, o_8, o_9]$. The hypothesized sequences may represent all possible combinations of $[o_6, o_7, o_8, o_9]$. In particular embodiments, however, base station 32 may use known scheduling information to eliminate candidates that are not possible.
3. For each of the hypothesized sequence for $[o_6, o_7, o_8, o_9]$:
    a. Multiplying the received vector $s_0, s_1, s_2, s_3, \ldots, s_{31}$ with the covering vector $c_0, c_1, c_2, c_3, \ldots, c_{31}$ corresponding to the hypothesized sequence for $[o_6, o_7, o_8, o_9,]$ in the table of FIG. 4 to obtain a modified received vector $s'_0, s'_1, s'_2, \ldots, s'_{31}$;
    b. Performing a fast Hadamard transform on the modified received vector $s'_0, s'_1, s'_2, s'_3, \ldots, s'_{31}$ to obtain the transformed values $h_0, h_1, h_2, h_3, \ldots, h_{31}$;
    c. Finding the index and the sign of the transformed value with the largest absolute value from a subset of the transformed values. The subset is determined by the set of known information bits; and
    d. Obtaining an intermediate information bit sequence estimate for the second order Reed-Muller code based on the index of the best transformed value and its sign. The absolute value of the transformed value associated with the intermediate information bit sequence estimate is also retained as the intermediate metric; and
4. Obtaining the final information bit sequence estimate from the intermediate information bit sequence estimate for the second order Reed-Muller code associated with the best intermediate metric.

The covering vectors referenced by Step 3(a) above comprise a representation of the associated hypothesis sequence that has been encoded using the same encoding scheme implemented on the transmitting side, possibly with additional processing to facilitate detection of the remaining bits. For example, in the embodiment described by the table in FIG. 4, each hypothesized sequence is associated with a covering vector $c_0, c_1, c_2, c_3, \ldots, c_{31}$, that represents a version of the hypothesized sequence that has been encoded using Equation (2) and the basis sequences associated with the bits addressed by the hypothesized sequence. Thus, for the illustrated example, an example in which the hypothesized sequences address bits $o_6, o_7, o_8$, and $o_9$, the covering vectors represent versions of the hypothesized sequences that have been encoded using Equation 1 and only the basis sequences $M_{i,6}, M_{i,7}, M_{i,8}$, and $M_{i,9}$. In other words, each example covering vector is based on an encoding of the corresponding hypothesized sequence using Equation (2) for $i=6, 7, 8, 9$. In the example embodiment described by FIG. 4, the resulting encoded bits ($b_i$) are then additionally processed by interleaving the bits according to Equation (3) and applying a binary to bipolar mapping, under which "0" values are mapped to "1" and "1" values are mapped to "−1," to produce the example covering vectors shown in the table of FIG. 4.

To illustrate how the second algorithm may be implemented by base station 32 in particular embodiments, consider an example where base station 32 has scheduled Component Carrier 0, Component Carrier 1, and Component Carrier 3. In this case, the set of known information bits would be $[o_4, o_5, o_6, o_9] = [0, 0, 0, 0]$. Suppose the actual feedback bit sequence generated by wireless terminal 20 is [1, 1, 0, 1, 0,] for the three scheduled component carriers, indicating that wireless terminal 20 successfully received assignments or scheduling grants and the corresponding scheduled transmissions for both antennas on CC0 and for one antenna on each of CC1 and CC3. The nominal feedback bit sequence encoded by wireless terminal 20 would then be [1, 1, 0, 1, 0, 0, 0, 1, 0, 0]. In an embodiment using the example encoding scheme described above, wireless terminal 20 would then produce a corresponding second-order Reed-Muller encoded codeword of [1, 0, 1, 0, 0, 1, 0, 0, 0, 1, 1, 0, 1, 0, 0, 0, 1, 1, 0, 0, 1, 0, 0, 0, 1, 1, 0, 0, 0, 1, 0] and transmit the codeword to base station 32 as part of an uplink control message 72.

Base station 32 receives the transmitted uplink control message 72 and may then perform the interleaving described by Equation 2 on the soft value sequence corresponding to the feedback bits to generate a received vector, $s_0, s_1, s_2, s_3, \ldots, s_{B-1}$. Suppose the received vector is given by $s_0, s_1, s_2, s_3, \ldots, s_{B-1} = [-1.2, 0.2, -0.9, 1.1, 0.4, -0.4, 1.6, 1.0, 1.2, -0.9, -1.1, 1.4, -1.3, 2.1, 0.9, 1.1, -0.5, -1.0, 1.0, 0.6, -0.9, 0.3, 1.4, 1.8, 0.7, -0.6, -0.4, 0.2, 0.3, 1.3, -1.2, 1.3]$ because of interference and noise in the wireless communication channel. In this example, $[o_8, o_9]$ is known to be $[0,0]$ as the fifth configured component carrier was not scheduled. Thus, only four hypotheses need to be formed in Step 2 for $[o_6, o_7, o_8, o_9]$. Moreover, since $[o_4, o_5]$ is known to be $[0, 0]$, the search subset for Step 3 is limited to $h_b$ with $b \in \{0, 1, 2, 3, 4, 5, 6, 7\}$.

For the hypothesis $[o_6, o_7, o_8, o_9] = [0, 0, 0, 0]$, the values of the covering vector are all "1" (as indicated in the table of FIG. 4). Hence the modified received vector $s'_0, s'_1, s'_2, s'_3, \ldots, s'_{31}$ is identical to the received vector $s_0, s_1, s_2, s_3, \ldots, s_{B-1}$. The relevant Hadamard transformed values and their associated bit sequences are:

|  | Positive |  | Negative |  |
|---|---|---|---|---|
| h0 = 9.4 -> | 000000 | or | 100000 | |
| h1 = -9.6 -> | 010000 | or | 110000 | |
| h2 = -10.0 -> | 001000 | or | 101000 | |
| h3 = 4.9 -> | 011000 | or | 111000 | |
| h4 = -10.1 -> | 000100 | or | 100100 | |
| h5 = 4.9 -> | 010100 | or | 110100 | |
| h6 = 2.0 -> | 001100 | or | 101100 | |
| h7 = 9.4 -> | 011100 | or | 111100 | (4) |

The intermediate information bit sequence estimate for the second order Reed-Muller code is hence [1, 0, 0, 1, 0, 0, 0, 0, 0, 0] and the intermediate metric is 10.1.

For the hypothesis $[o_6,o_7,o_8,o_9]=[0,1,0,0]$, the modified received vector $s'_0, s'_1, s'_2, s'_3, \ldots, s'_{31}$ is obtained from the received vector $s_0, s_1, s_2, s_3, \ldots, s_{B-1}$ by flip the signs of the 3, 4, 5, 10, 11, 13, 14, 15, 18, 20, 21, 22, 23, 25, 27, 31-th values.

The relevant Hadamard transformed values and their associated bit sequences are:

|  | Positive |  | Negative |
|---|---|---|---|
| h0 = -2.3 -> | 000000 | or | 100000 |
| h1 = 4.5 -> | 010000 | or | 110000 |
| h2 = -2.0 -> | 001000 | or | 101000 |
| h3 = -2.8 -> | 011000 | or | 111000 |
| h4 = 0.4 -> | 000100 | or | 100100 |
| h5 = -30.0 -> | 010100 | or | 110100 |
| h6 = 0.3 -> | 001100 | or | 101100 |
| h7 = 3.8 -> | 011100 | or | 111100 |

The intermediate information bit sequence estimate for the second order Reed-Muller code is hence [1, 1, 0, 1, 0, 0, 0, 1, 0, 0] and the intermediate metric is 30.0.

For the hypothesis $[o_6,o_7,o_8,o_9]=[1,0,0,0]$, the relevant Hadamard transformed values and associated bit sequences are:

|  | Positive |  | Negative |
|---|---|---|---|
| $h_0$ = 8.9 -> | 000000 | or | 100000 |
| $h_1$ = -2.0 -> | 010000 | or | 110000 |
| $h_2$ = -4.7 -> | 001000 | or | 101000 |
| $h_3$ = -7.1 -> | 011000 | or | 111000 |
| $h_4$ = 4.8 -> | 000100 | or | 100100 |
| $h_5$ = -1.6 -> | 010100 | or | 110100 |
| $h_6$ = 5.7 -> | 001100 | or | 101100 |
| $h_7$ = 4.6 -> | 011100 | or | 111100 |

The intermediate information bit sequence estimate for the second order Reed-Muller code is hence [0, 0, 0, 0, 0, 0, 1, 0, 0, 0] and the intermediate metric is 8.9.

For the hypothesis $[o_6,o_7,o_8,o_9]=[1,1,0,0]$, the relevant Hadamard transformed values and associated bit sequences are:

|  | Positive |  | Negative |
|---|---|---|---|
| h0 = 1.1 -> | 000000 | or | 100000 |
| h1 = 6.1 -> | 010000 | or | 110000 |
| h2 = -9.9 -> | 001000 | or | 101000 |
| h3 = 0.4 -> | 011000 | or | 111000 |
| h4 = -0.7 -> | 000100 | or | 100100 |
| h5 = -3.4 -> | 010100 | or | 110100 |
| h6 = -10.0 -> | 001100 | or | 101100 |
| h7 = -4.2 -> | 011100 | or | 111100 |

The intermediate information bit sequence estimate for the second order Reed-Muller code is hence [1, 0, 1, 1, 0, 0, 1, 1, 0, 0] and the intermediate metric is 10.0.

After cycling through all four hypothesized sequences for $[o_6,o_7,o_8,o_9]$ in this example, base station 32 determines that the best metric is 30.0 and the best information bit sequence estimate for the second-order Reed-Muller code is [1, 1, 0, 1, 0, 0, 0, 1, 0, 0]. Discarding from the bit sequence estimates feedback bits corresponding to unscheduled component carriers (i.e., the known bits $[o_4,o_5,o_8,o_9]=[0,0,0,0]$), base station 32 produces a final estimate for the feedback bit sequence of [1, 1, 0, 1, 0, 1], which is consistent with the original feedback bits sequence transmitted by wireless terminal 20.

Figures 5, 6:
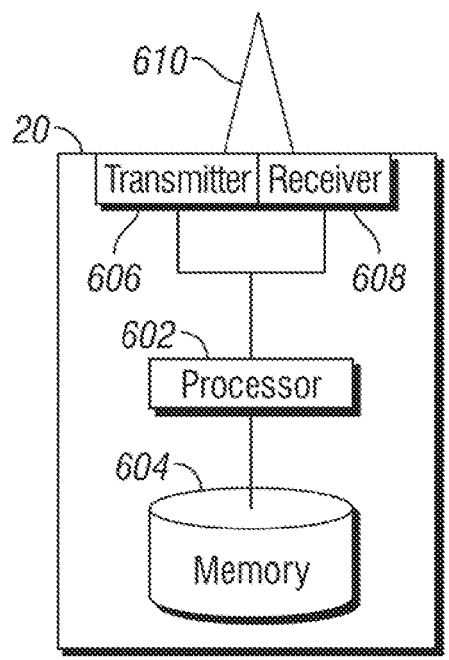
FIG. 5 is a table showing a comparison of the operational complexity of various decoding techniques that can be used to decode encoded feedback information.
FIG. 6 is a block diagram illustrating a particular embodiment of a wireless terminal that may be supported by the mobile communication system.

For this example, a brute-force ML decoder would require $32 \times 2^6 = 2048$ operations. Using this second algorithm, particular embodiments of base station 32 are able to decode the received feedback bits with four sign-flippings and four fast Hadamard transforms for a total complexity of 768 operations. Thus, particular embodiments of base station 32 can decode feedback bits in CA format uplink control messages 72 using decoding techniques with substantially reduced complexity. FIG. 5 shows a comparison of the operational complexity of decoding using a brute-force ML decoding technique to that achieved when the decoding techniques described above are implemented in certain embodiments of mobile communication system 10.

Thus, particular embodiments of mobile communication system 10 may employ control signaling techniques with improved reliability and/or decreased overhead. Additionally, particular embodiments of mobile communication system 10 may reduce the operational complexity of decoding certain types of control signaling. As a result, certain embodiments of mobile communication system 10 may provide numerous operational benefits. Nonetheless, specific embodiments of mobile communication system 10 may provide some, none, or all of these benefits.

FIG. 6 is a block diagram illustrating in greater detail contents of a particular embodiment of a wireless terminal 20. As shown in FIG. 6, the illustrated embodiment of wireless terminal 20 includes a processor 602, a memory 604, a transmitter 606, a receiver 608, and an antenna 610.

Processor 602 may represent or include any form of processing component, including dedicated microprocessors, general-purpose computers, or other devices capable of processing electronic information. Examples of processor 602 include field-programmable gate arrays (FPGAs), programmable microprocessors, digital signal processors (DSPs), application-specific integrated circuits (ASICs), and any other suitable specific- or general-purpose processors. Although FIG. 6 illustrates, for the sake of simplicity, an embodiment of wireless terminal 20 that includes a single processor 602, wireless terminal 20 may include any number of processors 602 configured to interoperate in any appropriate manner.

Memory 604 stores processor instructions, configuration information, power control parameters, format definitions, and/or any other data utilized by wireless terminal 20 during operation. Memory 604 may comprise any collection and arrangement of volatile or non-volatile, local or remote devices suitable for storing data, such as random access memory (RAM), read only memory (ROM), magnetic storage, optical storage, or any other suitable type of data storage components. Although shown as a single element in FIG. 6 memory 604 may include one or more physical components local to or remote from wireless terminal 20.

Antenna 610 represents any suitable conductor capable of receiving and transmitting wireless signals. Transmitter 606 transmits radiofrequency (RF) signals over antenna 610, and receiver 608 receives from antenna 610 RF certain signals transmitted by access network 30. Although the example embodiment in FIG. 6 includes certain numbers and configurations of antennas, receivers, and transmitters, alternative embodiments of wireless terminal 20 may include any suitable number of these components. Additionally, transmitter 606, receiver 608, and/or antenna 610 may represent, in part or in whole, the same physical components. For example, particular embodiments of wireless terminal 20 include a transceiver representing both transmitter 606 and receiver 608.

FIG. 7 is a flowchart illustrating example operation of a particular embodiment of wireless terminal 20 in selecting a format for an uplink control message 72 to use in responding to scheduled transmissions transmitted by access network 30. The steps illustrated in FIG. 7 may be combined, modified, or deleted where appropriate. Additional steps may also be added to the example operation. Furthermore, the described steps may be performed in any suitable order.

In particular embodiments, wireless terminal 20 may be informed of the component carriers configured for within the cell 60 served by base station 32. Thus, in FIG. 7, operation begins with wireless terminal 20 receiving, at step 700, configuration information. This configuration information identifies the primary carrier configured for cell 60 and any secondary component carriers configured for cell 60. At step 702, wireless terminal 20 stores this configuration information for later use.

In this example, base station 32 transmits to wireless terminal 20 one or more downlink control messages 70 scheduling component carriers for use by wireless terminal 20. As explained above with respect to FIG. 2, this scheduled use may involve receiving signals from base station 32 on the relevant component carrier or transmitting signals to base station 32 on the relevant component carrier. Base station 32 transmits at least PCC downlink control message 70a scheduling wireless terminal 20 to receive a downlink transmission on the primary component carrier. Base station 32 may also transmit one or more SCC downlink control messages 70b-d scheduling wireless terminal to receive a downlink transmission on secondary component carriers.

At step 704, wireless terminal 20 begins receiving downlink control messages 70 from base station 32. At step 706, wireless terminal 20 determines whether any of the successfully received downlink control messages 70 include scheduling information scheduling wireless terminal 20 to receive a transmission on a secondary component carrier. In particular embodiments, wireless terminal 20 may use stored configuration information to determine whether the scheduling information of each of the various received downlink control messages 70 is scheduling wireless terminal 20 on the primary component carrier or a secondary component carrier. Based on this determination, wireless terminal 20 then selects a format for an uplink control message 72. In particular embodiments, wireless terminal 20 selects from between a first format (e.g., the CA format described above) that carries separate feedback information for each of the configured component carriers and a second format (e.g., the SC format described above) that carries feedback information for the primary component carrier in cell 60, but does not include separate feedback bits for any of the secondary component carriers.

For example, in particular embodiments, wireless terminal 20 selects the second format (as shown at step 708) if wireless terminal 20 has only received a downlink control message 70 scheduling wireless terminal 20 to receive a transmission on the primary component carrier. The second format only includes feedback bits for a single component carrier (specifically, the primary component carrier). However, if wireless terminal 20 has received any downlink control messages 70 scheduling wireless terminal 20 to receive a transmission on a secondary carrier during the corresponding subframe, then wireless terminal 20 selects the first format instead (as shown at step 710). This first format permits wireless terminal to provide feedback bits for more than one component carrier.

After sending the one or more downlink control messages 70 containing the scheduling information, base station 32 transmits the scheduled transmissions on the designated component carriers. At an appropriate point in time after wireless terminal 20 was scheduled to receive these transmissions, wireless terminal 20 provides base station 32 feedback information indicating whether the scheduled transmissions were successfully received. Thus, at step 712, wireless terminal 20 generates an uplink control message 72 based on the selected format. This uplink control message 72 includes feedback information (e.g., one or more HARQ feedback bits) associated with at least one component carrier. As noted above, this feedback information indicates whether wireless terminal 20 successfully received transmissions on the relevant component carrier(s) that were scheduled by any downlink control messages 70 successfully received by wireless terminal 20. If wireless terminal 20 selected the first format, the generated uplink control message 72 may include separate feedback information for every component carrier configured for cell 60.

At step 714, wireless terminal 20 transmits the generated uplink control message 72 to base station 32. In particular embodiments, when base station 32 schedules wireless terminal 20 to receive transmissions on secondary component carriers in addition to the primary component carrier but only receives an uplink control message 72 with feedback information for a single component carrier, base station 32 is configured to recognize that the component carrier associated with the feedback information is the primary component carrier and that wireless terminal 20 must not have received any of the control messages 70 scheduling secondary carriers that base station 32 transmitted during the subframe. Thus, in particular embodiments, base station 32 can correctly interpret the feedback information in the uplink control message 72 despite the fact that the received downlink control message 70 may not include explicit feedback information for every component carrier on which base station 32 scheduled wireless terminal 20 to receive a transmission. The operation of wireless terminal 20 may then continue indefinitely or end as shown in FIG. 7.

Figure 8:
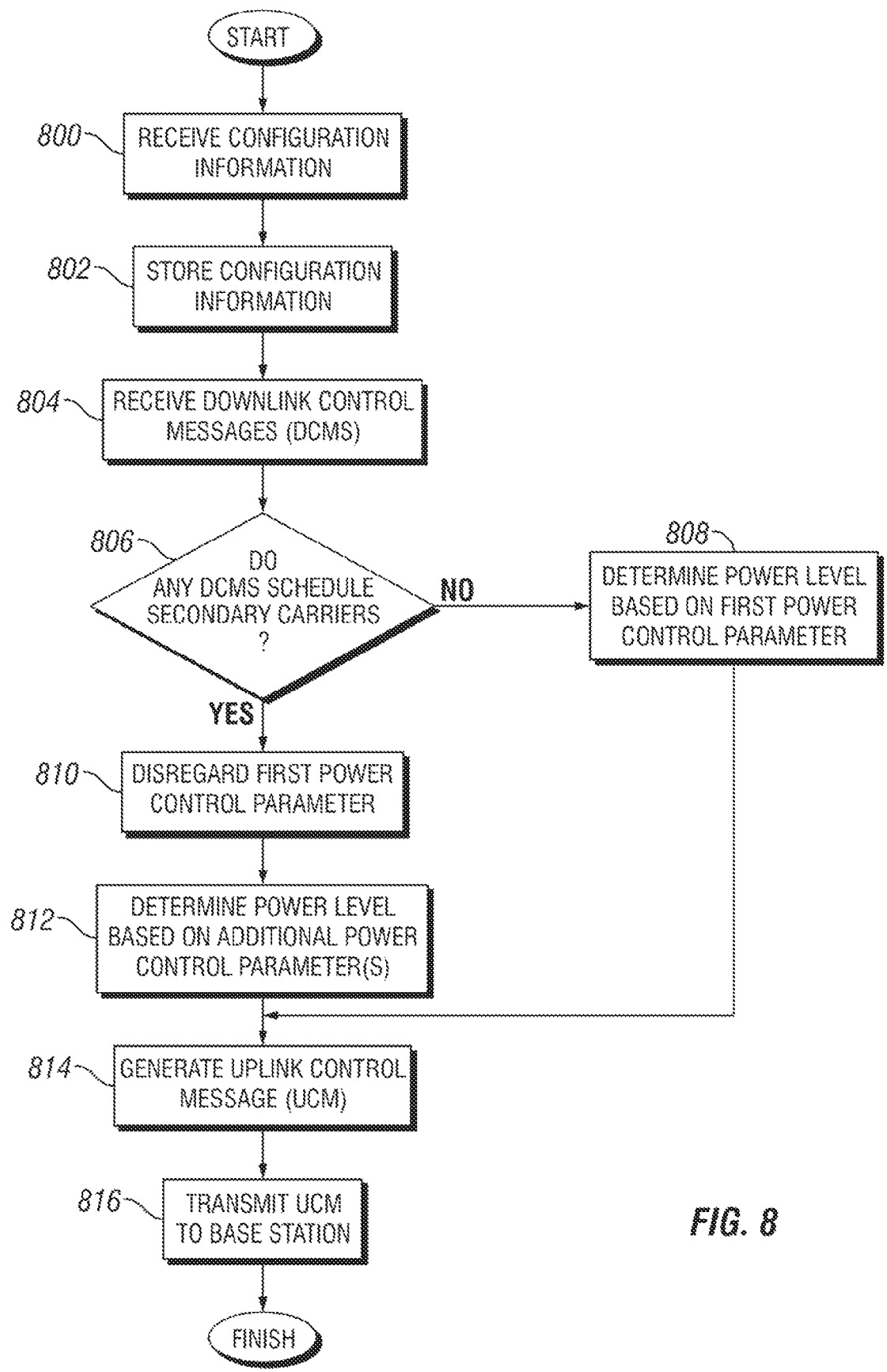
FIG. 8 is a flowchart showing example operation of a particular embodiment of the wireless terminal in determining a transmission power level at which to transmit uplink control messages.

FIG. 8 is a flowchart illustrating example operation of a particular embodiment of wireless terminal 20 in determining a transmission power level to use in transmitting an uplink control message 72 in response to scheduling information transmitted by access network 30. The steps illustrated in FIG. 8 may be combined, modified, or deleted where appropriate. Additional steps may also be added to the example operation. Furthermore, the described steps may be performed in any suitable order.

As explained above with respect to FIG. 2, wireless terminal 20 may, in particular embodiments, be informed of the component carriers configured for use within cell 60. Accordingly, in FIG. 8, operation begins with wireless terminal 20 receiving, at step 800, configuration information that identifies the primary carrier configured for cell 60 and any secondary component carriers configured for cell 60. At step 802, wireless terminal 20 may store this configuration information for later use.

In this example, base station 32 transmits to wireless terminal 20 one or more downlink control messages 70 scheduling wireless terminal 20 to receive downlink transmissions on component carriers. Base station 32 transmits at least a PCC control message 70a scheduling wireless terminal 20 to receive a transmission on the primary component carrier that contains a first power control parameter. Base station 32 may also transmit one or more SCC control messages 70b-d scheduling wireless terminal 20 to receive transmissions on secondary component carriers. These SCC downlink control messages 70b-d each contain power control parameters as well, either a second power control parameter or one of multiple additional power control parameters.

At step 804, wireless terminal 20 begins receiving downlink control messages 70 from base station 32. At step 806, wireless terminal 20 determines whether any of the successfully received downlink control messages 70 include scheduling information scheduling the wireless terminal to receive a transmission on a secondary component carrier. If wireless terminal 20 determines at step 806 that any of the successfully received downlink control messages 70 includes scheduling information scheduling wireless terminal 20 to receive a transmission on a secondary component carrier, then operation will proceed to step 810. Otherwise, at step 808, wireless terminal 20 will determine a transmission power level based on the first power control parameter included in PCC control message 70a (assuming the wireless terminal 20 successfully receives PCC control message 70a).

However, if wireless terminal 20 determines at step 806 that wireless terminal 20 has successfully received at least one downlink control message 70 scheduling wireless terminal 20 to receive a transmission on a secondary component carrier (i.e. one of SCC control messages 70b-d), wireless terminal 20 determines a transmission power level based on one or more of the power control parameters included in the successfully received SCC control messages 70b-d. In particular embodiments, wireless terminal 20 may disregard the power control parameter included in PCC control message 70a, as shown at step 810. Instead, wireless terminal 20 determines, at step 812, the transmission power level based on the second/additional power control parameters in the successfully received SCC control messages 70b-d. As explained above, wireless terminal 20 may determine the transmission power level by extracting a common power control parameter included in all of SCC control messages 70b-d, summing a plurality of different power control parameters included in the received SCC control messages 70b-d, or combining power control parameters from multiple received SCC control messages 70b-d in any appropriate manner.

At step 814, wireless terminal 20 generates an uplink control message 72 responding to downlink control messages 70. The generated uplink control message 72 includes feedback information (e.g., HARQ feedback bits) associated with at least one component carrier. This feedback information indicates whether wireless terminal 20 has received a scheduled transmission on the associated carrier. As explained with respect to FIG. 7, particular embodiments of wireless terminal 20 may choose a format for this uplink control message 72 based on whether or not wireless terminal 20 successfully received any of SCC control messages 70b-d. At step 816, wireless terminal 20 transmits the generated uplink control message 72 to base station 32 at the determined transmission power level. Operation of wireless terminal 20 may then continue indefinitely or end as shown in FIG. 8.

Figures 9, 10:
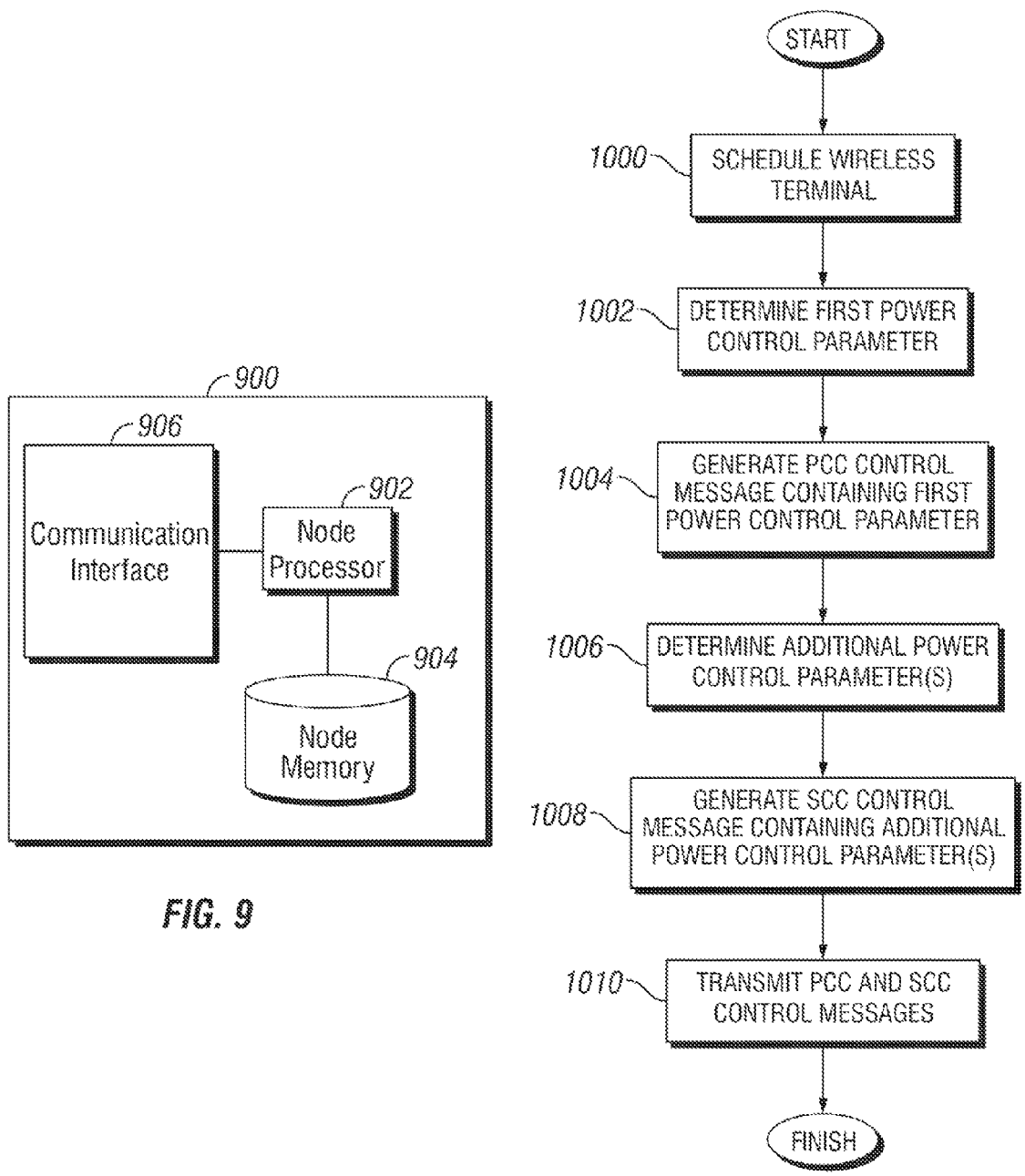
FIG. 9 is a block diagram illustrating a particular embodiment of a network node that may be utilized in mobile communication system.
FIG. 10 is a flowchart showing example operation of the network node in managing the transmission power level of the wireless terminal.

FIG. 9 is a block diagram illustrating in greater detail the contents of a particular embodiment of a network node 900 managing the transmission power of wireless terminal 20 in transmitting uplink control messages 72 and/or of decoding uplink control messages 72 transmitted by wireless terminal 20. Network node 900 may represent any suitable element of access network 30 capable of providing the described functionality, such as base station 32 in the embodiment illustrated by FIG. 1. As shown in FIG. 9, the example embodiment of network node 900 includes a node processor 902, a node memory 904, and a communication interface 906.

Node processor 902 may represent or include any form of processing component, including dedicated microprocessors, general-purpose computers, or other forms of electronic circuitry capable of processing electronic information. Examples of node processor 902 include field-programmable gate arrays (FPGAs), programmable microprocessors, digital signal processors (DSPs), application-specific integrated circuits (ASICs), and any other suitable specific- or general-purpose processors. Although FIG. 9 illustrates, for the sake of simplicity, an embodiment of network node 900 that includes a single node processor 902, network node 900 may include any number of node processors 902 configured to interoperate in any appropriate manner.

Node memory 904 stores processor instructions, carrier configurations, power parameters, and/or any other data utilized by network node 900 during operation. Node memory 904 may comprise any collection and arrangement of volatile or non-volatile, local or remote devices suitable for storing data, such as random access memory (RAM), read only memory (ROM), magnetic storage, optical storage, or any other suitable type of data storage components. Although shown as a single element in FIG. 9, node memory 904 may include one or more physical components local to or remote from network node 900.

Communication interface 906 comprises electronic circuitry and other components suitable to permit network node 900 to communicate with wireless terminal 20. For example, in embodiments in which network node 900 represents a node separate from the radio elements of access network 30 (e.g., a radio network controller) communication interface 906 may represent circuitry capable of communicating over a wireline connection between network node 900 and the radio elements of access network 30. In such embodiments, network node 400 may use communication interface 906 to transmit information to radio elements (such as base stations 32) that are capable of communicating wirelessly with wireless terminal 20. As an alternative example, in embodiments in which network node 900 itself represents a radio element (such as an enhanced Node B (eNodeB) in a Long Term Evolution (LTE) system), communication interface 906 may instead include circuitry and components capable of communicating with wireless terminal 20 over a radio link, such as an antenna and radiofrequency transmitter and receiver.

FIG. 10 is a flowchart illustrating example operation of a particular embodiment of network node 900 in managing the transmission power of wireless terminal 20 in transmitting uplink control messages 72. The steps illustrated in FIG. 10 may be combined, modified, or deleted where appropriate. Additional steps may also be added to the example operation. Furthermore, the described steps may be performed in any suitable order.

Operation begins in this example with network node 900 scheduling a wireless terminal to receive downlink transmissions on component carriers in cell 60 during a particular subframe at step 1000. For purposes of this example it is assumed that, during the relevant subframe, network node 900 schedules wireless terminal 20 to receive transmissions on the primary component carrier and at least one of the secondary carriers configured for cell 60.

In order to manage the amount of power wireless terminal 20 will use in confirming receipt of the downlink control messages 70, network node 900 may determine, at step 1002, a first power control parameter for wireless terminal 20 to use in transmitting uplink control messages in accordance with a first format that permits wireless terminal 20 to communicate feedback information relating to only a single component carrier (in this case, the primary component carrier for cell 60). Once the first power control parameter has been generated, network node 900 may generate, at step 1004, PCC control message 70a that includes the first power control parameter and scheduling information scheduling wireless terminal 20 a transmission on the primary component carrier during the subframe.

Because in this example network node 900 has scheduled wireless terminal 20 to receive a transmission on at least one secondary component carrier in addition to the primary component carrier, network node 900) also determines one or more additional power control parameters for the wireless terminal to use in transmitting an uplink control message 72 in accordance with a second format at step 1006. This second uplink control message format permits wireless terminal 20 to communicate feedback information relating to multiple component carriers.

As noted above, base station 32 may determine the one or more additional power control parameters in any appropriate manner depending on the configuration and capabilities of base station 32. For example, in particular embodiments, base station 32 may determine a single power control parameter for use by wireless terminal 20 in responding to SCC control messages 70b-d scheduling transmissions on secondary component carriers and may include this same power control parameter in all SCC control messages 70b-d. Base station 32 may determine this single power control parameter based on the number of component carriers configured for cell 60, based on the number of component carriers scheduled for wireless terminal in this subframe, based on the specific component carriers scheduled or configured (e.g., using a lookup table similar to those in FIGS. 3A-3D), and/or based on any other appropriate factor or consideration. In alternative embodiments, base station 32 may determine multiple different power control parameters, one for each secondary component carrier on which wireless terminal 20 is scheduled to receive a transmission during the subframe. In general, base station 32 may use any suitable technique to determine the one or more additional power control parameters.

After determining the additional power control parameter(s), base station 32 generates one or more SCC control messages (e.g., SCC control messages 70b-d) at step 1008, one for each of the secondary component carriers on which base station 32 has scheduled wireless terminal 20 to received transmissions during the relevant subframe. The SCC control message(s) each include the additional power control parameter or, if multiple are generated, one of the additional power control parameters. Base station 32 then transmits PCC control message 70a and SCC control messages 70b-d to wireless terminal 20 at step 1010. Operation of base station 32 with respect to transmitting downlink control messages 70 may then terminate as shown in FIG. 10.

FIGS. 11 and 12 are flowcharts illustrating example operation of a particular embodiment of network node 900 in decoding information transmitted by wireless terminal 20. In particular, FIG. 11 illustrates an example in which network node 900 implements the first algorithm described above on an uplink control message 72 carrying six or fewer feedback bits, and FIG. 12 illustrates an example in which network node 900 implements the second algorithm described above on an uplink control message 72 carrying more than six feedback bits. Certain embodiments of network node 900 may be capable of implementing only one of the algorithms, while other embodiments may be capable of implementing both. In particular embodiments, network node 900 may be configured to select an appropriate algorithm to use based on the number of component carriers currently configured for use in cell 60. The steps illustrated in FIGS. 11 and 12 may be combined, modified, or deleted where appropriate. Additional steps may also be added to the example operation. Furthermore, the described steps may be performed in any suitable order.

In FIG. 11, operation begins with network node 900 transmitting one or more downlink control messages 70 to wireless terminal 20 at step 1100. The downlink control messages 70 include scheduling information scheduling wireless terminal 20 to receive transmissions on a plurality of component carriers configured for cell 60. Wireless terminal 20 receives the transmitted downlink control messages 70 and attempts to decode them. Because network node 900 and wireless terminal 20 communicate over an imperfect channel, network node 900 may not receive some of the transmitted downlink control messages 70 at all or may be unable to decode some of these downlink control messages 70 because of corruption occurring during transmission. As a result, wireless terminal 20 will respond to downlink control messages 70 by generating feedback information (e.g., HARQ feedback bits in embodiments implementing LTE) indicating the component carriers for which wireless terminal 20 successfully received scheduled transmissions.

Wireless terminal 20 then encodes the unencoded feedback information. For the example in FIG. 11, it is assumed that the feedback information includes six or less bits and that wireless terminal 20 encodes the feedback information using a first-order Reed Muller code. After encoding the feedback information, wireless terminal 20 transmits the encoded feedback information to network node 900 as part of an uplink control message 72 (e.g., as part of a UCI message on the PUCCH in embodiments implementing LTE).

Network node 900 receives the transmitted uplink control message 72, which includes a vector of encoded information bits as shown at step 1102. This vector of encoded information bits comprises an encoded representation of the feedback information bits generated by wireless terminal 20, but, the signal strength of the encoded bits may potentially have been deteriorated as a result of transmission over the radio channel between wireless terminal 20 and network node 900. As a result, network node 900 attempts to decode the encoded feedback information and to determine the original unencoded feedback information. As part of this process, network node 900 generates a vector of transform values by performing a Hadamard Transform on the received vector at step 1104.

Because network node 900 has the benefit of knowing which component carriers network node 900 scheduled wireless terminal 20 on for the current subframe, network node 900 can use this information to eliminate certain possibilities for the bit combinations transmitted by wireless terminal 20. Thus, at step 1106, network node 900 identifies a subset of the transform values based on scheduling information associated with the wireless terminal 20. Each transform value reflects the likelihood that a feedback information bit sequence associated with that transform value was the original, unencoded information bit sequence generated by wireless terminal 20. By limiting analysis of transform values to only those transform values associated with realistic candidates, particular embodiments of network node 900 can significantly reduce the processing resources used to determine the best estimate of the original feedback information.

For example, in particular embodiments, network node 900 may store the scheduling information included in the various downlink control messages 70 transmitted to wireless terminal 20. This scheduling information may include an indication of the component carriers on which wireless terminal 20 is scheduled to receive transmissions, information indicating whether wireless terminal is permitted to transmit scheduling requests during this subframe, and/or any other appropriate information pertaining to the transmission resources wireless terminal 20 is permitted to use during the subframe or the manner in which wireless terminal 20 is permitted to use such resources. Upon receiving the encoded feedback information, network node 900 uses the stored scheduling information to determine on which component carriers network node 900 did not schedule wireless terminal 20 to receive a transmission during the relevant subframe. Because network node 900 does not transmit any scheduling information to wireless terminal 20 for component carriers on which network node 900 did not schedule wireless terminal 20 to receive a transmission, network node 900 can safely assume in particular embodiments that the original feedback information generated by wireless terminal 20 did not indicate receipt of scheduling information for any such component carriers. Based on this assumption, network node 900 can form the subset by eliminating possible candidates for the original, unencoded feedback information that would indicate wireless terminal 20 did receive scheduling information for unscheduled component carriers.

At step 1108, network node 900 selects, from the subset of transform values, one of the transform values based on a magnitude of the selected transform value. Accordingly, network node 900 may then determine an estimate of the original, unencoded feedback information based on a bit sequence associated with the selected transform value at step 1110. For example, in particular embodiments, each transformed value in the vector of transform values is associated with two potential candidates for the original, unencoded feedback information, and network node 900 selects one of those candidates based on a sign (i.e., positive or negative) of the transformed value.

After decoding the original information bits, network node 900 may take appropriate actions based on the decoded information. For instance, if the decoded information indicates that wireless terminal 20 did not successfully receive a transmission scheduled for certain component carriers that network node 900 scheduled for wireless terminal 20, network node 900 may, depending on the circumstances, decide to re-schedule some or all of the downlink transmissions. The relevant downlink transmissions may be selected based, in some manner, on the decoded feedback bits. Once network node 900 has completed decoding the original information bits, operation of network node 900 may end as indicated in FIG. 11.

FIG. 12 illustrates example operation of an embodiment of network node 900 in which network node 900 applies a second algorithm to decode the received feedback information. When the original, unencoded feedback information includes more than six bits, it may be more efficient for network node 900 to apply a similar technique to that described above for six bits of the encoded feedback information but to test hypotheses for the remaining bits. As a result, FIG. 12 illustrates an example operation for an embodiment of network node 900 configured to do this.

Operation in this example begins at step 1200 with network node 900 transmitting one or more downlink control messages 70 to wireless terminal 20. Operation proceeds in a similar manner to that described above with network node 900 receiving an uplink control message 72 transmitted by wireless terminal 20 that contains a vector of encoded information bits at step 1202.

At step 1204, network node 900 determines a plurality of hypothesized sequences corresponding to a first group of the unencoded feedback bits. In particular embodiments, the number of unencoded feedback bits in this first group is equal to the amount by which the original information bit sequence exceeds six bits. For example, if the original, unencoded feedback information included ten bits, network node 900 would determine every possible combination for the remaining bits—that is, every possible 4-bit sequence. However, if network node 900 knows that certain combinations are not possible based on the scheduling information originally transmitted to wireless terminal 20, network node 900 may be able to eliminate certain sequences. For example, if network node 900 did not schedule component carriers associated with the final two bits of the ten bits of feedback information, network node 900 may be able to eliminate the 4-bit sequences that do not have zeros (or the predetermined value indicating non-receipt) for the relevant bits as possible candidates.

After determining the possible hypothesized sequences for the bits in the first group, network node 900 multiplies the received vector by a covering vector associated with each possible hypothesized sequence to generate a modified received vector for each hypothesized sequence (of bits in the first group) at step 1206. At step 1208, network node 900 performs a Hadamard Transform on each of the modified received vectors to obtain a transformed vector associated with each possible hypothesized sequence (of bits in the first group). Additionally, each of the transform values is associated with one or more bit sequence estimates for the second group of bits in the unencoded feedback information. This second group includes the bit of the unencoded feedback information that are not included in the first group (for purposes of this example, the second group includes the first six bits of the unencoded feedback information).

Network node 900 then identifies a subset of the transform values in all of the transform vectors based on the known scheduling information for wireless terminal 20 at step 1210. In particular embodiments, network node 900 may form the subgroup of transformed values by eliminating those transformed values associated with estimates (of the second group of original information bits) that would indicate wireless terminal received scheduling information for component carriers on which network node 900 did not schedule wireless terminal 20 to receive a transmission. For example, if the second group of bits included information about Component Carrier 0, Component Carrier 1, and Component Carrier 2, and network node 900 did not schedule wireless terminal 20 to receive any transmissions on Component Carrier 1 this subframe, network node 900 would identify the subgroup by eliminating from consideration all transform values associated with estimates for the second group of bits that would indicate that wireless terminal 20 received scheduling information for Component Carrier 1.

Network node 900 then selects from the identified subset of transform values a transform value based on a magnitude of the selected transform value at step 1212. For example, in particular embodiments, each transform value reflects the likelihood that one of the associated bit sequence estimates correctly identifies the second group of bits in the original feedback information. In such embodiments, network node 900 selects, from the identified subset of transform values, the transform value with the greatest magnitude. Network node 900 may do this by directly identifying the transform value with the overall greatest magnitude. Alternatively, network node 900) may do this iteratively by identifying intermediate "best" values representing the transform value with the greatest magnitude for each transform vector and then selecting the greatest from among the intermediate values for each transform vector.

At step 1214, network node 900 determines an estimate of the unencoded feedback information. In particular embodiments, this estimate is formed from an estimate of the first group of unencoded feedback bits and an estimate of the second group of unencoded feedback bits. The estimate of the first group of unencoded feedback bits is determined based on the hypothesized sequence associated with the modified vector that was used to generate the selected transform value. The estimate of the second group of unencoded feedback information is a selected one of the bit sequence estimates associated with the selected transform value. For example, in particular embodiments, each transform value is associated with two bit sequence estimates for the second group and network node 900 selects one of the two bit sequence estimates based on a sign of the selected transform value.

After completing the decoding, network node 900 may take appropriate actions based on the decoded information. For example, depending on the circumstances, network node 900 may decide to retransmit certain downlink control messages 70 selected in some manner based on the decoded information. Operation of network node 900 may end with respect to decoding the received information as indicated in FIG. 12.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A method of operating a base station terminal that is configured to wireless communication over a primary carrier and at least one secondary carrier, the method comprising:
   transmitting, from the base station, one or more downlink control messages to the wireless terminal, wherein each downlink control message contains scheduling information scheduling the wireless terminal to receive a downlink transmission on either a primary carrier or a secondary carrier during a first subframe;
   wherein a format for an uplink control message is based on whether any of the one or more downlink control messages includes scheduling information scheduling the wireless terminal to receive a downlink transmission on a secondary carrier;
   receiving an uplink control message from the wireless terminal, the uplink control message based on the selected format, wherein the uplink control message includes feedback information associated with at least one carrier, the feedback information indicating whether the wireless terminal has received a downlink transmission scheduled for the associated carrier.

2. The method of claim 1, wherein the uplink control message includes a scheduling request requesting that the wireless terminal be scheduled to transmit data to the base station.

3. The method of claim 1, wherein the base station is configured to permit communication with the wireless terminal using the primary carrier and a plurality of secondary carriers, and wherein:
   at least one of the downlink control messages includes scheduling information scheduling the wireless terminal to receive a downlink transmission on a secondary carrier; and
   the received uplink control message comprises a first format for the uplink control message, wherein the first format includes at least one feedback bit associated with each of the configured carriers.

4. The method of claim 1, wherein:
   the base station is configured to permit communication with the wireless terminal using the primary carrier and a plurality of secondary carriers;
   transmitting one or more downlink control messages comprises transmitting only a single downlink control message for the first subframe, wherein:
      the only received downlink control message includes scheduling information scheduling the wireless terminal to receive a downlink transmission on the primary carrier; and
      the received uplink control message comprises a second format for the uplink control message, wherein the second format includes feedback information associated with the primary carrier, but does not include feedback information associated with any of the secondary carriers.

5. The method of claim 1, wherein the one or more downlink control messages transmitted by a base station comprises one or more Downlink Control Information (DCI) messages transmitted by the base station over a Physical Downlink Control CHannel (PDCCH); and
   the uplink control message comprises an uplink control information (UCI) message over a Physical Uplink Control CHannel (PUCCH).

6. A base station that is configured to wireless communication over a primary carrier and at least one secondary carrier, the base station comprising:
   a hardware processor;
   a memory for storing instructions;
   a transceiver tar transmitting and receiving wireless signals;
   the base station configured to:
   transmit, from the base station, one or more downlink control messages to the wireless terminal, wherein each downlink control message contains scheduling information scheduling the wireless terminal to receive a downlink transmission on either a primary carrier or a secondary carrier during a first subframe;
   wherein a format for an uplink control message is based on whether any of the one or more downlink control messages includes scheduling information scheduling the wireless terminal to receive a downlink transmission on a secondary carrier;
   receive an uplink control message from the wireless terminal, the uplink control message based on the selected format, wherein the uplink control message includes feedback information associated with at least one carrier, the feedback information indicating whether the wireless terminal has received a downlink transmission scheduled for the associated carrier.

7. The base station of claim 6, wherein the uplink control message includes a scheduling request requesting that the wireless terminal be scheduled to transmit data to the base station.

8. The base station of claim 6, wherein the base station is configured to permit communication with the wireless terminal using the primary carrier and a plurality of secondary carriers, and wherein:

at least one of the downlink control messages includes scheduling information scheduling the wireless terminal to receive a downlink transmission on a secondary carrier; and the received uplink control message comprises a first format for the uplink control message, wherein the first format includes at least one feedback bit associated with each of the configured carriers.

9. The base station of claim 6, wherein:

the base station is configured to permit communication with the wireless terminal using the primary carrier and a plurality of secondary carriers;

transmitting one or more downlink control messages comprises transmitting only a single downlink control message for the first subframe, wherein:

the only received downlink control message includes scheduling information scheduling the wireless terminal to receive a downlink transmission on the primary carrier; and the received uplink control message comprises a second format for the uplink control message, wherein the second format includes feedback information associated with the primary carrier, but does not include feedback information associated with any of the secondary carriers.

10. The base station of claim 6, wherein the one or more downlink control messages transmitted by a base station comprises one or more Downlink Control Information (DCI) messages transmitted by the base station over a Physical Downlink Control CHannel (PDCCH); and the uplink control message comprises an uplink control information (UCI) message over a Physical Uplink Control CHannel (PUCCH).

\* \* \* \* \*

UNITED STATES PATENT AND TRADEMARK OFFICE
CERTIFICATE OF CORRECTION

PATENT NO. : 9,277,546 B2
APPLICATION NO. : 14/325287
DATED : March 1, 2016
INVENTOR(S) : Baldemair et al.

Page 1 of 1

It is certified that error appears in the above-identified patent and that said Letters Patent is hereby corrected as shown below:

In the specification,

In Column 1, Line 5, delete "U.S.C." and insert -- U.S.C. § --, therefor.

In Column 1, Line 8, delete "2011," and insert -- 2011, now Pat. No. 8,774,123, --, therefor.

In Column 17, Line 15, delete "$s_6=r_3$, $s_{22}=r_{26}$," and insert -- $s_6=r_3$, $s_{22}=r_{26}$ --, therefor.

In Column 18, Line 37, delete "$h_h$" and insert -- $h_b$ --, therefor.

In Column 19, Line 48, delete "$o_9$,]" and insert -- $o_9$] --, therefor.

In Column 20, Line 31, delete "$[o_4,o_5,o_6,o_9]$" and insert -- $[o_4,o_5,o_8,o_9]$ --, therefor.

In Column 20, Line 32, delete "[1, 1, 0, 1, 0,]" and insert -- [1, 1, 0, 1, 0, 1] --, therefor.

In Column 25, Line 33, delete "(i.e." and insert -- (i.e., --, therefor.

In Column 27, Line 18, delete "900)" and insert -- 900 --, therefor.

In Column 28, Line 44, delete "but," and insert -- but --, therefor.

In Column 31, Line 4, delete "900)" and insert -- 900 --, therefor.

In the claims,

In Column 32, Line 39, in Claim 6, delete "tar" and insert -- for --, therefor.

Signed and Sealed this
Seventh Day of June, 2016

Michelle K. Lee
*Director of the United States Patent and Trademark Office*